(12) United States Patent
Chen et al.

(10) Patent No.: US 12,074,206 B2
(45) Date of Patent: Aug. 27, 2024

(54) INTEGRATED CIRCUIT DEVICE WITH IMPROVED RELIABILITY

(71) Applicant: Taiwan Semiconductor Manufacturing Company, Ltd., Hsinchu (TW)

(72) Inventors: Chia-Wei Chen, Hsinchu (TW); Chih-Yu Hsu, Hsinchu (TW); Hui-Chi Chen, Hsinchu County (TW); Shan-Mei Liao, Hsinchu (TW); Jian-Hao Chen, Hsinchu (TW); Cheng-Hao Hou, Hsinchu (TW); Huang-Chin Chen, Hsinchu (TW); Cheng Hong Yang, Hsinchu (TW); Shih-Hao Lin, Hsinchu (TW); Tsung-Da Lin, Hsinchu (TW); Da-Yuan Lee, Hsinchu (TW); Kuo-Feng Yu, Hsinchu County (TW); Feng-Cheng Yang, Hsinchu County (TW); Chi On Chui, Hsinchu (TW); Yen-Ming Chen, Hsin-Chu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 435 days.

(21) Appl. No.: 17/461,499

(22) Filed: Aug. 30, 2021

(65) Prior Publication Data

US 2023/0063857 A1 Mar. 2, 2023

(51) Int. Cl.
*H01L 29/423* (2006.01)
*H01L 21/3105* (2006.01)
*H01L 29/40* (2006.01)
*H01L 29/417* (2006.01)
*H01L 29/51* (2006.01)
*H01L 29/786* (2006.01)

(52) U.S. Cl.
CPC .... *H01L 29/42392* (2013.01); *H01L 21/3105* (2013.01); *H01L 29/401* (2013.01); *H01L 29/41775* (2013.01); *H01L 29/517* (2013.01); *H01L 29/78696* (2013.01)

(58) Field of Classification Search
CPC ......... H01L 29/42392; H01L 29/78696; H01L 29/517; H01L 29/41775; H01L 29/401; H01L 21/3105; H01L 21/02332; H01L 21/28202; H01L 21/3115; H01L 29/518; H01L 29/66795
See application file for complete search history.

(56) References Cited

U.S. PATENT DOCUMENTS 9,818,872 B2   11/2017   Ching et al.
9,887,269 B2   2/2018   Ching et al.
(Continued)

*Primary Examiner* — Changhyun Yi
(74) *Attorney, Agent, or Firm* — HAYNES AND BOONE, LLP

(57) ABSTRACT

A device includes a semiconductor substrate, a fin structure on the semiconductor substrate, a gate structure on the fin structure, and a pair of source/drain features on both sides of the gate structure. The gate structure includes an interfacial layer on the fin structure, a gate dielectric layer on the interfacial layer, and a gate electrode layer of a conductive material on and directly contacting the gate dielectric layer. The gate dielectric layer includes nitrogen element.

20 Claims, 29 Drawing Sheets

(56) References Cited

U.S. PATENT DOCUMENTS

| | | | |
|---|---|---|---|
| 9,899,398 | B1 | 2/2018 | Colinge et al. |
| 10,032,627 | B2 | 7/2018 | Lee et al. |
| 10,109,721 | B2 | 10/2018 | Lin et al. |
| 10,157,799 | B2 | 12/2018 | Ching et al. |
| 10,199,502 | B2 | 2/2019 | Huang et al. |
| 10,290,546 | B2 | 5/2019 | Chiang et al. |
| 10,475,902 | B2 | 11/2019 | Lee et al. |
| 2018/0175036 | A1 | 6/2018 | Ching et al. |
| 2021/0328038 | A1* | 10/2021 | Kim ................ H01L 21/823842 |

\* cited by examiner

INTEGRATED CIRCUIT DEVICE WITH IMPROVED RELIABILITY

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of IC processing and manufacturing. For these advances to be realized, similar developments in IC processing and manufacturing are needed. For example, circuit devices generally benefit from uniform threshold voltages and low minimum voltages. However, as feature sizes continue to shrink, optimizing these parameters have become increasingly challenging, which challenges have been shown to adversely affect performance, reliability, and/or yield. Accordingly, although existing technologies are generally adequate for their intended purposes, they are not satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
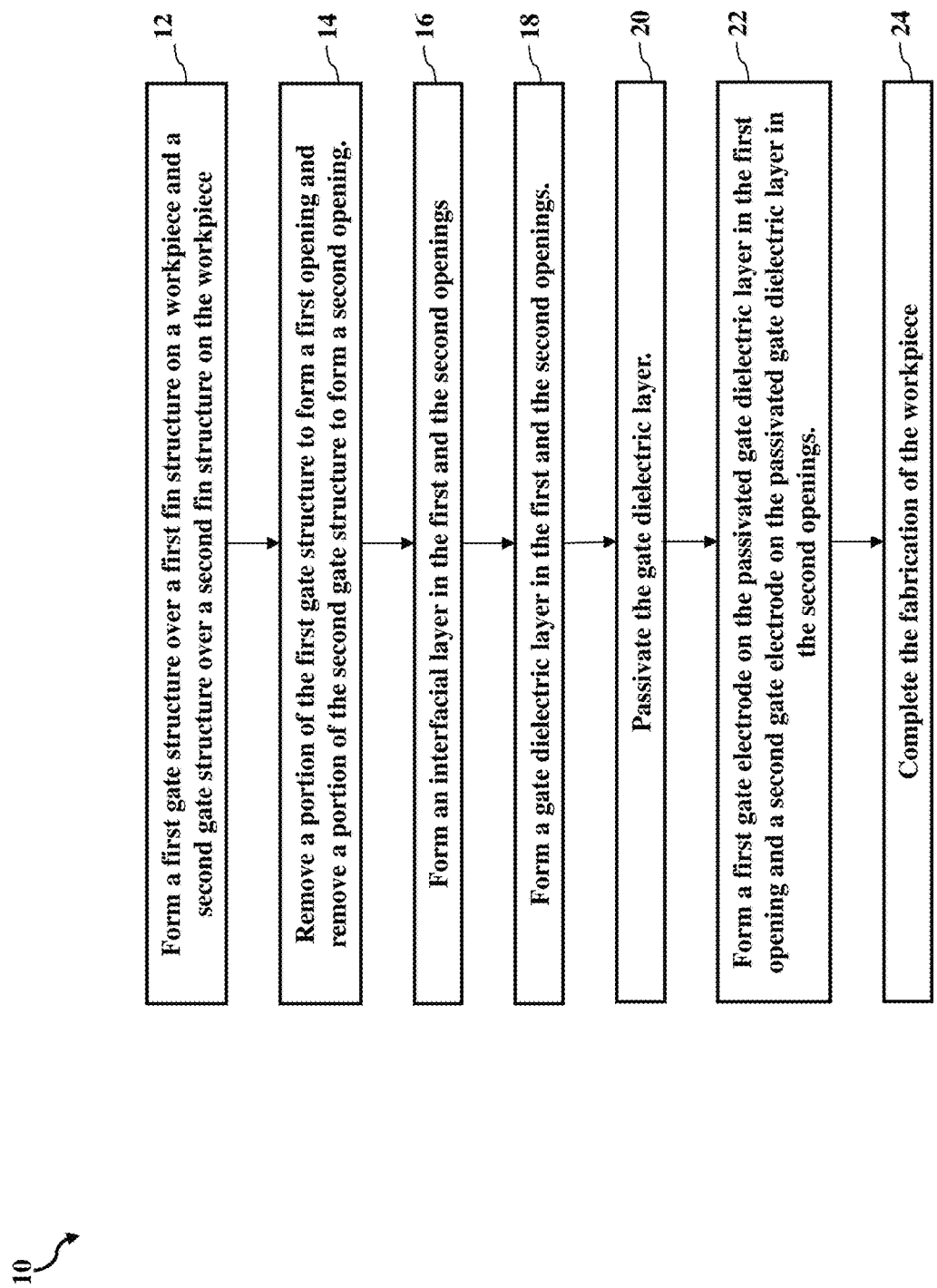
FIGS. 1A and 1B are flow charts of a method for fabricating an IC device according to various aspects of the present disclosure.

The present disclosure relates generally to integrated circuit (IC) devices, and more particularly, to IC devices with improved threshold voltage uniformity and/or improved minimum voltages.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

At its most basic, a transistor may include a semiconductor material doped to form source/drain features separated by a channel region. A gate structure is disposed on the channel region and includes a gate electrode, as well as a gate dielectric that separates the gate electrode from the channel region. The gate dielectric serves the dual function as a capacitive material when the transistor is turned "ON" and as an insulating material when the transistor is turned "OFF." Generally, the improvement in performances require smaller gate dielectric thicknesses. Such reduction in the gate dielectric thickness, however, may lead to increase in the leakage current in the "OFF" state. Accordingly, this present disclosure provides device structures and methods to reduce such increase in the leakage current, thereby compensating the adverse effect of the smaller gate dielectric thickness. As described in more detail below, proper amount of nitrogen element is introduced into the gate dielectric via an annealing operation, which serves to reduce the leakage current and improve device reliability.

Various methods for forming gate stacks and related gate structures are disclosed herein, which may be implemented in any of a variety of device types. For example, aspects of the present disclosure may be implemented to form gate stacks suitable for planar field-effect transistors (FETs), multi-gate transistors (planar or vertical), such as fin-like FET (FinFET) devices, nano-sheet-based devices (including gate-all-around (GAA) devices, multi-bridge channel (MBC) devices, etc.), omega-gate (Ω-gate) devices, or pi-gate (Π-gate) devices, as well as strained-semiconductor devices, silicon-on-insulator (SOI) devices, partially-depleted SOI devices, fully-depleted SOI devices, or other devices. Moreover, the devices presented herein may be a complementary metal-oxide-semiconductor (CMOS) device, a p-type metal-oxide-semiconductor (pMOS) device, or an n-type metal-oxide-semiconductor (nMOS) device. The present disclosure contemplates that one of ordinary skill may recognize other IC devices that can benefit from the gate formation methods and/or gate structures described herein.

Figure 1B:
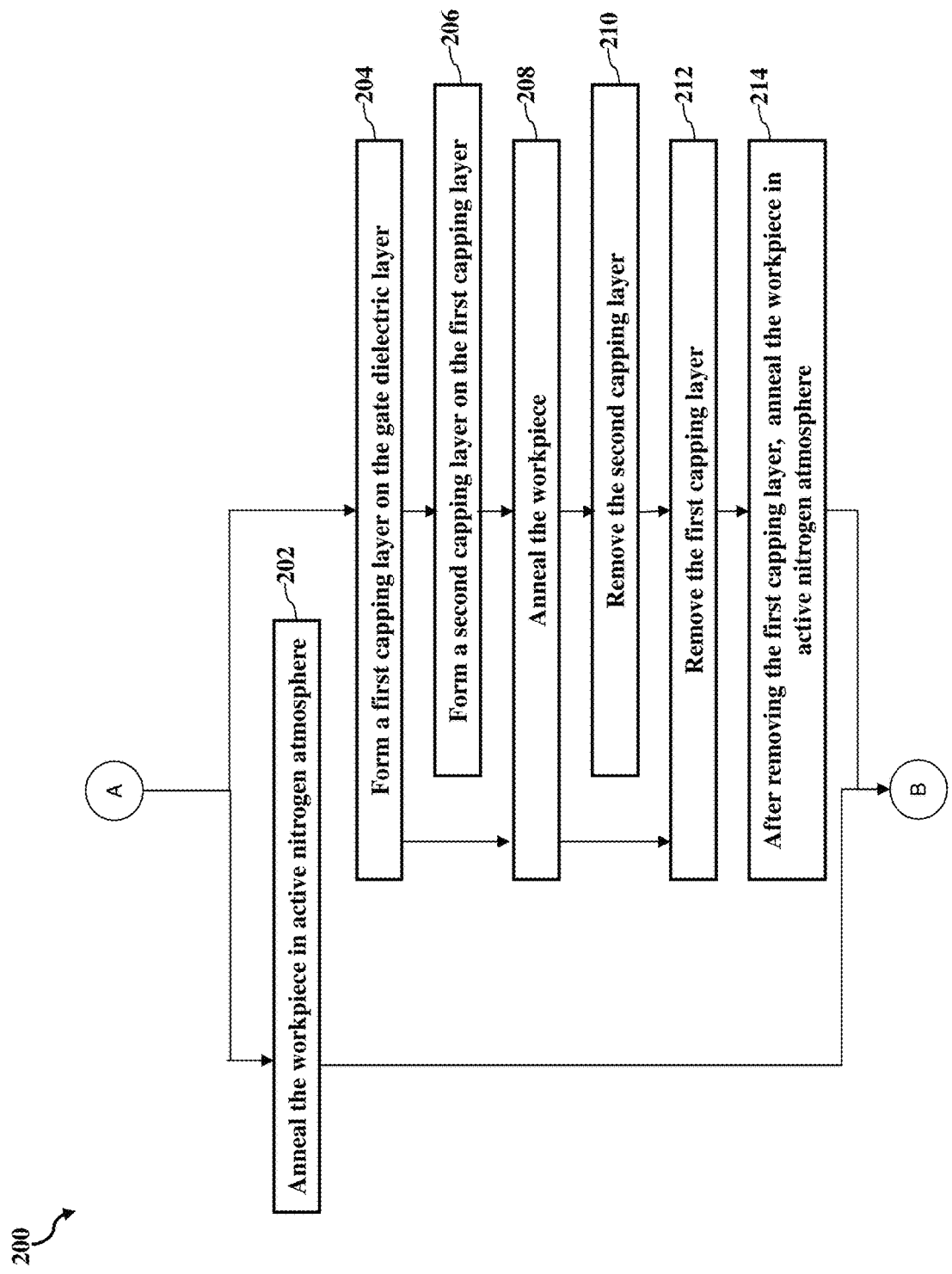

FIGS. 1A and 1B illustrate a flow chart of a method 10 for fabricating an IC device according to various aspects of the present disclosure. At block 12 of FIG. 1A, method 10 includes forming a first gate structure over a first fin structure on a workpiece, for example, in a p-type region, and a second gate structure over a second fin structure on the workpiece, for example, in an n-type region. At block 14 of FIG. 1A, method 10 includes removing a portion of the first gate structure thereby forming a first opening, and removing a portion of the second gate structure thereby forming a second opening. In some implementations, a dummy gate stack (including, for example, a polysilicon gate electrode) is removed from the gate structure. At block 16 of FIG. 1A, method 10 includes forming an interfacial layer in the first and the second gate structures. At block 18 of FIG. 1A, method 10 includes forming a gate dielectric layer, such as a high-k dielectric layer, in the first and the second openings and on the interfacial layer. At block 20 of FIG. 1A, method 10 proceeds to passivate the gate dielectric layer. At block 22 of FIG. 1A, a first gate electrode is formed on and directly contacting the passivated gate dielectric layer in the first opening; and a second gate electrode is formed on and directly contacting the passivated gate dielectric layer in the second openings. At block 24 of FIG. 1A, additional steps are performed to complete the fabrication of the IC device, which may include forming a multi-layer interconnect structure.

According to embodiments of the present disclosure, there may be several alternative methods for passivation step of block 20. These alternative methods, collectively referred to as the method portion 200, are further illustrated in FIG. 1B. The method portion 200 proceeds from block 18 of FIG. 1A. In a first approach, at block 202 of FIG. 1B, an annealing process is conducted on the workpiece in an atmosphere that includes active nitrogen (such as ammonia or another suitable gas that includes a nitrogen atom in its molecular structure that is capable of reacting with the gate dielectric material). Then, the method portion 200 proceeds onto block 22 of FIG. 1A. In a second approach, proceeding from the block 18 of FIG. 1A, the method portioni 200 forms a first capping layer on the gate dielectric layer at block 204 of FIG. 1B. It then proceeds to block 208, where an annealing process is conducted on the workpiece, for example, in an inert atmosphere. Subsequently, the method portion 200 proceeds further to block 212 where the first capping layer is removed. At block 214, another annealing operation is conducted on the workpiece in an atmosphere that includes active nitrogen. The method portion 200 then proceeds to block 22 of FIG. 1A. The third approach generally resembles that of the second approach, except that following the forming of the first capping layer on the gate dielectric layer at block 204, the method portion 200 proceeds to form a second capping layer on the first capping layer; and after annealing the workpiece in the inert atmosphere, the second capping layer is removed prior to the removing of the first capping layer. These aspects of the present disclosure are described in more detail with reference to FIGS. 2-24.

FIGS. 2-13 are diagrammatic fragmentary cross-sectional side views of a workpiece for a fin-based IC device 100 (also interchangeably referred to as a "device 100" or "workpiece 100"), in portion or entirety, at various fabrication stages (such as those associated with method 10 in FIGS. 1A and 1B) according to various aspects of the present disclosure. FIG. 14 is a diagrammatic top view of the workpiece 100, in portion or entirety, at one fabrication stage according to various aspects of the present disclosure. Fin-based IC device 100 may include planar transistors or multi-gate transistors, such as FinFETs, nano-sheet-based transistors depending on design requirements. FIGS. 2-14 have been simplified for the sake of clarity to better understand the inventive concepts of the present disclosure. Additional features can be added in fin-based IC device 100, and some of the features described below can be replaced, modified, or eliminated in other embodiments of fin-based IC device 100.

Figure 2:
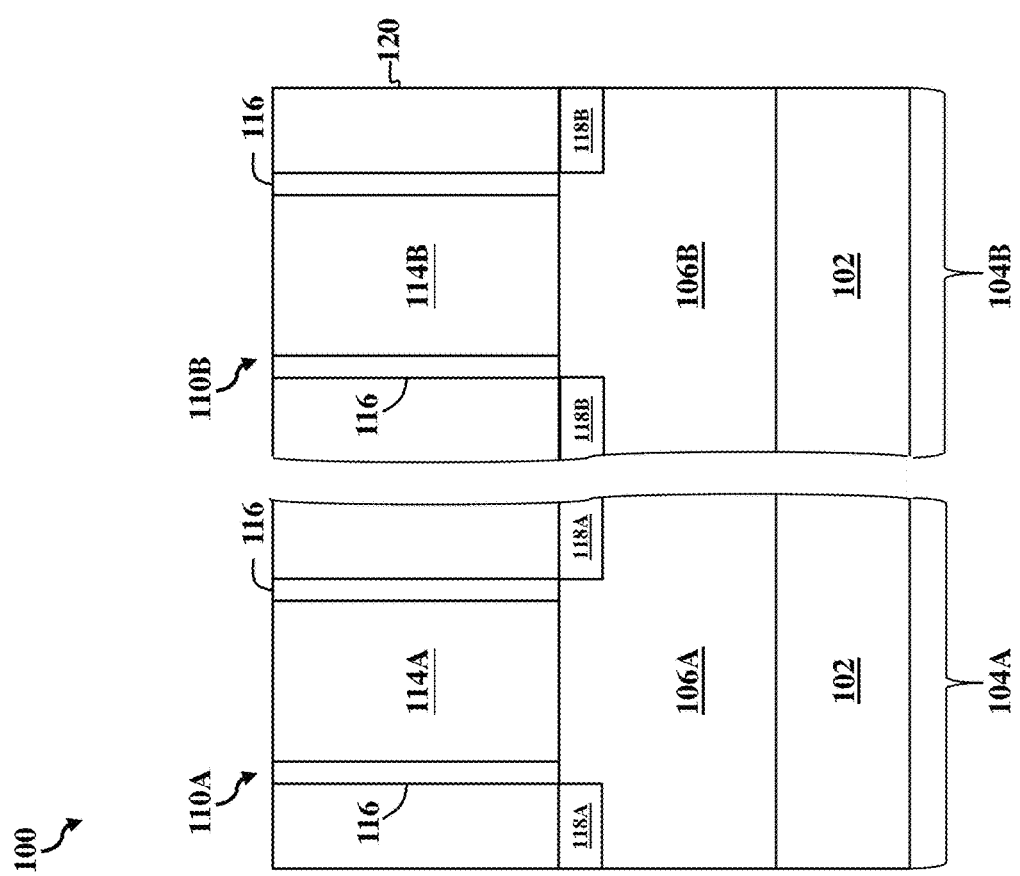
FIGS. 2, 3, 4, 5A, 5B, 5C, 5D, 5E, 6, 7, 8, 9, 10, 11, 12, 13, 14, 15, 16, 17, 18, 19, 20, 21, 22, and 23 are fragmentary diagrammatic views of an IC device, in portion or entirety, at various fabrication stages, such as those associated with the method of FIGS. 1A and 1B, according to various aspects of the present disclosure.

Turning to FIG. 2, a workpiece 100 is received that includes a substrate (e.g. a wafer) 102. In the depicted embodiment, substrate 102 is a semiconductor substrate, including, for example, silicon. Alternatively, or additionally, substrate 102 includes another elementary semiconductor, such as germanium, a compound semiconductor, an alloy semiconductor, or combinations thereof. Alternatively, substrate 102 is a semiconductor-on-insulator substrate. Various regions are defined for substrate 102, such as a p-type doped region 104A (or p-type region 104A) and an n-type doped region 104B (or n-type region 104B). These n-type and p-type regions may each include one or more FinFETs configured as transistors. In some implementations, the n-type region and/or the p-type region may or may not be contiguous, and any number of devices and/or device features (for example, isolation features, dummy features, and/or other device features) may be formed between the n-type region and the p-type region depending on design requirements of fin-based IC device 100.

The p-type region and the n-type region each includes at least one fin structure, such as fin structure 106A and fin structure 106B, respectively. Though not evident in the depicted view, fin structure 106A and/or fin structure 106B can include more than one fin depending on design requirements of their respective FinFET device. In some implementations, fin structures 106A and 106B are a portion of substrate 102 (such as a portion of a material layer of substrate 102). Alternatively, in some implementations, fin structures 106A and 106B are defined in a material layer, such as one or more semiconductor material layers overlying substrate 102. This aspect of the disclosure is discussed in more detail with respect to FIGS. 14-23.

Fin structures 106A and 106B are formed over substrate 102 using any suitable process. In some implementations, a combination of deposition, lithography and/or etching processes are performed to define fin structures 106A and 106B extending from substrate 102 as illustrated in FIG. 2. Alternatively, fin structures 106A and 106B are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some implementations, directed self-assembly (DSA) techniques are implemented while forming fin structures 106A and 106B. Further, in some implementations, the exposure process can implement maskless lithography, electron-beam (e-beam) writing, ion-beam writing and/or nanoprint technology for patterning the resist layer.

Isolation feature(s) are formed over and/or in substrate 102 to isolate various regions and/or features of fin-based IC device 100. For example, isolation features define and electrically isolate the n-type region and the p-type region from each other, fin structures 106A and 106B from each other, and/or fins of fin structures 106A and 106B from each other. Isolation features include silicon oxide, silicon nitride, silicon oxynitride, other suitable isolation material (for example, including silicon, oxygen, nitrogen, carbon, or other suitable isolation constituent), or combinations thereof. Isolation features can include different structures, such as shallow trench isolation (STI) structures, deep trench isolation (DTI) structures, and/or local oxidation of silicon (LOCOS) structures.

Various gate structures are disposed over fin structures 106A and 106B, such as a gate structure 110A disposed over fin structure 106A, and a gate structure 110B disposed over fin structure 106B. Though not evident in the depicted view, gate structures 110A and 110B wrap a portion of fin structures 106A and 106B, respectively, such that gate structures 110A and 110B interpose a source region and a drain region (collectively referred to as source/drain regions) of fin structures 106A and 106B, respectively. Gate structures 110A and 110B engage channel regions defined between the source regions and the drain regions, such that current can flow between the source/drain regions during operation. In the depicted embodiment, gate structures 110A and 110B include gate stacks configured for a gate last process. For example, gate structures 110A and 110B respectively include dummy gate layers 114A and 114B (including, for example, polysilicon). Dummy gate layers 114A and 114B can include a multi-layer structure. For example, in some implementations, dummy gate layers 114A and 114B include a dummy gate dielectric layer and a dummy gate electrode layer. In many embodiments, gate structures 110A and 110B further include interfacial layers between the fin structures 106A and 106B and the dummy gate layers 114A and 114B.

Gate structures 110A and 110B are formed by deposition processes, lithography processes, etching processes, other suitable processes, or combinations thereof. Gate structures 110A and 110B further include spacers 116, which are disposed adjacent to (for example, along sidewalls of) the gate stacks (here, dummy gate layers 114A and 114B, respectively). Spacers 116 are formed by any suitable process and include a dielectric material. In some implementations, spacers 116 include a multi-layer structure, such as a first dielectric layer that includes silicon nitride and a second dielectric layer that includes silicon oxide. Implantation, diffusion, and/or annealing processes may be performed to form lightly doped source and drain (LDD) features and/or heavily doped source and drain (HDD) features in source/drain regions of fin structures 106A and 106B before and/or after forming spacers 116, depending on design requirements of fin-based IC device 100.

Epitaxial source features and epitaxial drain features (referred to as epitaxial source/drain features 118A and 118B) may be disposed in source/drain regions of fin structures 106A and 106B such that the gate structures 110A and 110B respectively interpose epitaxial source/drain features 118A and 118B. Epitaxial source/drain features 118A and 118B are doped with n-type dopants or p-type dopants depending on whether the devices are configured as n-type devices or p-type devices. In the depicted embodiment, the p-type region 104A is configured with n-type FinFETs. Epitaxial source/drain features 118A, therefore, includes silicon and/or carbon, and are doped with phosphorous, arsenic, or other n-type dopant. Similarly, the n-type region 104B is configured with p-type FinFETs. Epitaxial source/drain features 118B, therefore, includes silicon and/or germanium, and are doped with boron, boron fluoride, or other p-type dopant. The epitaxial source/drain features 118A and 118B may include the same or different materials and may include the same or different dopants. In some implementations, the fin structures 106A and 106B are recessed, such that epitaxial source/drain features 118A and 118B are grown from recessed portions of fin structures 106A and 106B.

An interlevel dielectric (ILD) layer 120 is disposed over substrate 102, and includes a dielectric material such as silicon oxide, silicon nitride, silicon oxynitride, TEOS formed oxide, PSG, BPSG, low-k dielectric material, other suitable dielectric material, or combinations thereof. In some implementations, a contact etch stop layer (CESL) is disposed between ILD layer 120 and fin structures 106A and 106B and/or gate structures 110A and 110B. The CESL includes a material different than ILD layer 120, such as a dielectric material that is different than the dielectric material of ILD layer 120. A CMP process and/or other planarization process may be performed to expose a top portion of gate structures 110A and 110B. In the depicted embodiment, top surfaces of dummy gate layers 114A and 114B are substantially planar with a top surface of ILD layer 120.

Turning to FIGS. 3-12, a gate replacement process is performed, where dummy gate stacks of gate structures 110A and 110B are replaced with metal gate stacks. During processing, one or more of the gate layers of gate structures 110A and 110B may be altered when exposed to external ambient as fin-based IC device 100 is transferred between processing systems for processing. For example, surfaces of one or more of the gate layers of gate structures 110A and 110B may be oxidized when exposed to oxygen in ambient air, undesirably altering the threshold voltages corresponding with gate structures 110A and 110B. To minimize such occurrences, in some implementations, one or more of the gate layers of gate structures 110A and 110B can be processed "in-situ," which may refer to performing various processes on fin-based IC device 100 within the same IC processing system or IC processing tool, allowing fin-based IC device 100 to remain under vacuum conditions during the various processes. In some embodiments, "in-situ" may also refer to performing various processes on fin-based IC device 100 without exposing fin-based IC device 100 to an external ambient (for example, external to an IC processing system), such as atmospheric oxygen.

Figure 3:
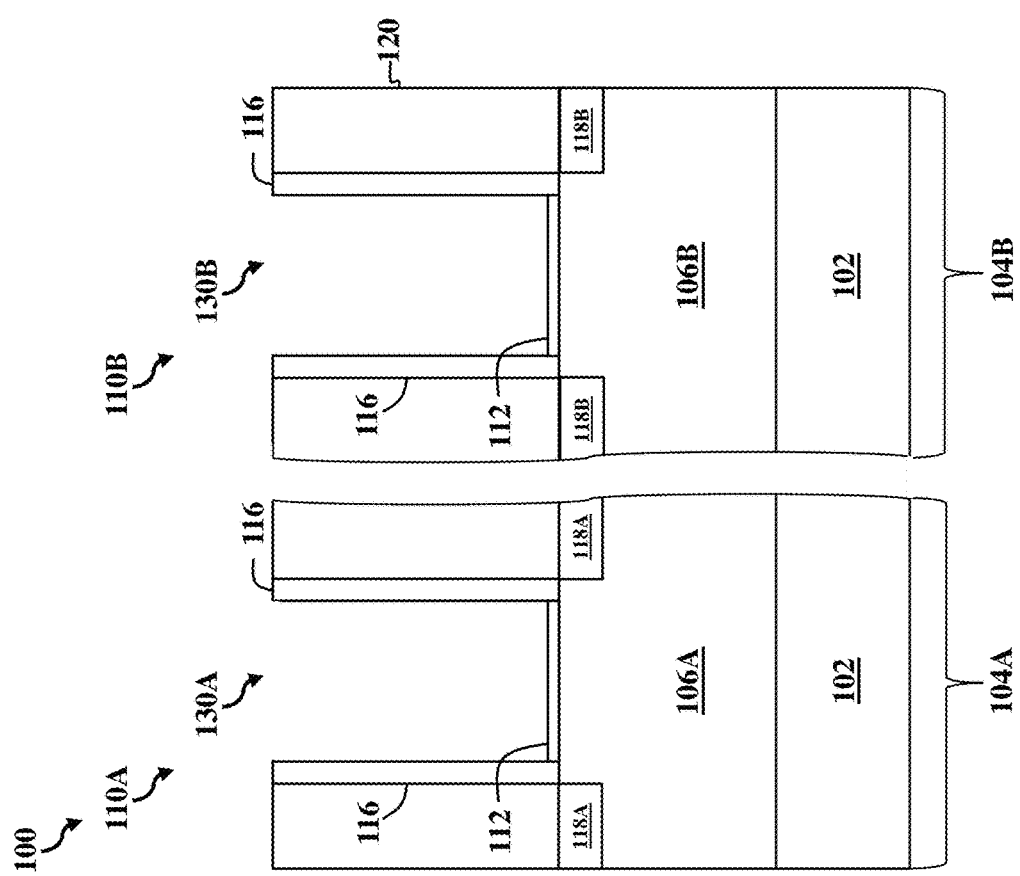

Turning to FIG. 3, an etching process selectively removes dummy gate layers 114A and 114B of gate structures 110A and 110B, thereby forming an opening 130A in gate structure 110A and an opening 130B in gate structure 110B. The etching process may be a dry etching process, a wet etching process, or combinations thereof. The etching process can be tuned, such that dummy gate layers 114A and 114B are removed without (or minimally) etching other features of fin-based IC device 100, such as ILD layer 120, spacers 116, and/or fin structures 106A and 106B. Interfacial layers 112 are formed on the fin structures 106A and 106B in the openings 130A and 130B, for example, directly contacting the top surfaces of the fin structures 106A, 106B exposed in the openings 130A, 130B. In the depicted embodiment, openings 130A and 130B (also referred to as gate trenches) have sidewall surfaces defined by spacers 116 and bottom surfaces defined by interfacial layers 112. In the depicted embodiments, the interfacial layers 112 each includes a dielectric material, such as silicon oxide. The interfacial layers 112 may improve interfacial properties between the fin structure materials and the subsequently formed gate dielectric layers. The interfacial layers 112 may be formed by any suitable methods. In the depicted embodiments, the interfacial layers 112 are thermally formed. For example, a top layer of the silicon material of the fin structures 106A, 106B is thermally oxidized into silicon dioxide which serves as the interfacial layers 112. In such embodiments, the interfacial layers 112 are formed only at the bottom of the openings 130A, 130B and are not substantially formed on sidewall surfaces of the openings 130A, 130B. Alternatively, the interfacial layers 112 may be formed by chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), spin coating, plating, other deposition process, or combinations thereof. In some embodiments, the interfacial layers 112 are conformal layers. In some embodiments, the thickness of the interfacial layers 112 is tuned in conjunction with other subsequent gate dielectric layers in order to improve device performances (such as speeds). For example, the interfacial layers 112 may have a thickness of about 0.5 nm to about 1.5 nm.

Figure 4:
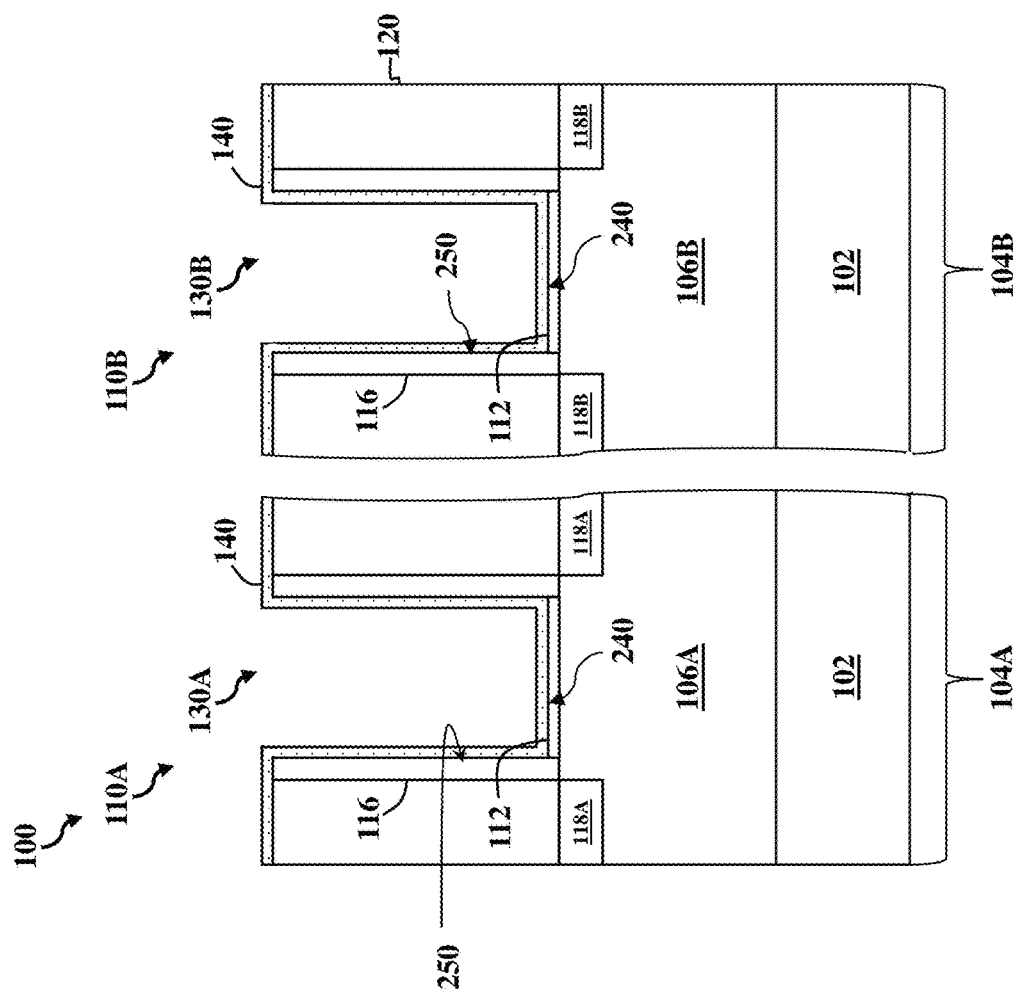

Turning to FIG. 4, a gate dielectric layer 140 is formed over the interfacial layers 112. Moreover, the gate dielectric layer 140 is formed on sidewall surfaces of the spacers 116. The gate dielectric layer 140 includes a dielectric material, such as silicon oxide or other suitable dielectric material. In the depicted embodiment, gate dielectric layer 140 includes a high-k dielectric material (and thus may be referred to as a high-k dielectric layer 140), such as hafnium dioxide ($HfO_2$), HfSiO, HfTaO, HfTiO, HfZrO, zirconium oxide, aluminum oxide, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). In many embodiments, the gate dielectric layer 140 has a thickness of about 10 Å to about 20 Å. The gate dielectric layer 140 may be formed by any suitable methods, such as CVD, PVD, ALD, HDPCVD, MOCVD, RPCVD, PECVD, LPCVD, ALCVD, APCVD, spin coating, plating, other deposition process, or combinations thereof. For example, a gate dielectric layer 140 may be conformally deposited over the interfacial layers 112 by an ALD process, such that gate dielectric layer 140 has a substantially uniform thickness and partially fills openings 130A and 130B. In the depicted embodiment, gate dielectric layer 140 is disposed on sidewall surfaces and bottom surfaces that define openings 130A and 130B, such that gate dielectric layer 140 is disposed on the top surfaces of the interfacial layers 112, on the sidewall and upper surfaces of the spacers 116, as well as on the upper surfaces of the ILD layer 120. The interface between the gate dielectric layer 140 and the interfacial layer 112 is designated as the interface 240. Meanwhile, the interface between the gate dielectric layer 140 and the spacers 116 is designated as the interface 250.

At this processing stage, the method 10 proceeds to passivate the gate dielectric layer 140. In the first approach described above, turning to block 202 of FIG. 1B and to FIG. 5A, the gate dielectric layer 140 is subject to an annealing operation 304 in an atmosphere that includes active nitrogen. Active nitrogen refers to a gas that includes nitrogen element and is sufficiently active to react with dielectric materials (such as interfacial layers 112 and/or gate dielectric layer 140). In other words, active nitrogen is distinct from nitrogen gas ($N_2$) which is generally considered inert under the annealing operation condition. In some embodiments, the annealing atmosphere includes ammonia ($NH_3$), and the active nitrogen is the ammonia nitrogen. Alternatively, the active nitrogen may be nitrogen of organic amines, organic amides, hydrazine, nitrogen ($N_2$) radical, nitrogen ($N_2$) plasma, ammonia radical, ammonia plasma, and nitric oxide (NO). The active nitrogen may be dosed at a volumetric concentration of about 10% to about 60%. For example, ammonia gas is used to provide the active nitrogen while nitrogen gas ($N_2$) is used as the carrier gas. The ammonia gas is dosed at a flow rate of $r(NH_3)$. The nitrogen gas is dosed at a flow rate of $r(N_2)$. A ratio of $r(NH_3)/(r(NH_3)+r(N_2))$ is about 0.1 to about 0.6. In some embodiments, the annealing operation includes a first temperature ramp that increases from the room temperature to a soak temperature of about 520° C. to about 590° C. In some embodiments, the annealing operation maintains this soak temperature for a time duration of about 5 seconds to about 30 seconds. Moreover, in some embodiments, the annealing operation may maintain a soak pressure at about 1 Torr to about 20 Torr. Furthermore, the annealing operation includes a spike annealing step. A spike anneal is a method of rapid thermal anneal (RTA) process, in which the temperature may be ramped up at a rate of several hundred degrees per second. For example, in the depicted embodiments, the annealing temperature is rapidly ramped up to a temperature of about 800° C. to 900° C. within a time duration of less than 1 second, and subsequently cooled down to room temperature. In many embodiments, despite the short time duration, the spike annealing step contributes to the majority of the property changes of the gate dielectric layer 140 as compared to prior to the annealing operation 304.

As described above, the gate dielectric layer 140 is exposed in the openings 130A, 130B. Accordingly, the gate dielectric layer 140 is directly exposed to the active nitrogen during the annealing operation 304. In other words, the active nitrogen has access to directly contact the gate dielectric layer 140. Without being limited by theory, in some embodiments, the active nitrogen reacts and bonds with the dangling bonds at the exposed top and sidewall surfaces of the gate dielectric layer 140. This reaction causes the gate dielectric layer 140 to be passivated. As a result, electron migration rate in and through the gate dielectric layer 140, in absence of external voltage bias (such as in the OFF-state), is reduced. As such migration rate is determinative of the OFF-state leakage current in an n-type device, the passivation of gate dielectric layer 140 results in minimized leakage current in the n-type device. If the soak temperature or the spike temperature of the annealing operation 304 is too low, the soak time is too short, ammonia gas concentration is too low, or the soak pressure is too low, the reaction between the dielectric material and the active nitrogen may be too slow and/or too ineffective such that insufficient amount of nitrogen element is incorporated. In other words, the passivation of the gate dielectric layer may be incomplete. Accordingly, the reduction in the leakage current may not be significant enough to justify the extra processing cost. On the other hand, the passivation of the gate dielectric layer may also increase the migration rate of holes as the charge carriers, for example, in p-type devices. If the soak temperature or the spike temperature of the annealing operation 304 is too high, the soak time is too long, ammonia gas concentration is too high, or the soak pressure is too high, the reaction between the dielectric material and the active nitrogen may be too strong such that an excessive amount of nitrogen element is incorporated in the gate dielectric layer 140. Such excessive amount of nitrogen may increase the leakage current for a p-type device, and thereby adversely affecting the reliability of the p-type devices that often coexist with the n-type devices (such as in a static random-access memory). In other words, the parameters provided here balances the effects of nitrogen passivation on the n-type device and the p-type device, thereby optimizing the overall IC device characteristics.

The reaction between the gas including the active nitrogen (such as ammonia) and the gate dielectric layer 140 causes nitrogen atoms to be incorporated into the gate dielectric layer 140. Particularly, because the reaction initiates at the exposed top and sidewall surfaces of the gate dielectric layer 140, the exposed top and sidewall surfaces of the gate dielectric layer 140 includes a substantial amount of nitrogen atom. Additionally, because nitrogen atoms migrate under the annealing conditions, substantial portions of the nitrogen atoms are distributed throughout the gate dielectric layer 140. For example, nitrogen atoms further migrate towards and into the interfacial layers 112, and towards and into the spacers 116. The annealing parameters may be further fine-tuned to control the profile of the nitrogen distribution in the gate dielectric layer 140, the interfacial layers 112, and/or the spacers 116. Accordingly, the interfaces 240 and 250 may each include a substantial amount of nitrogen atom. The amount of nitrogen atoms incorporated may be characterized by a ratio of the number of nitrogen atoms to the numbers of an element of the gate dielectric layer 140 at a specified interface. In some embodiments, the gate dielectric layer 140 includes hafnium (Hf). A ratio (r) of the number of nitrogen atoms to the number of Hf atoms at the interface 240 may be about 2:98 to about 5:95. In some embodiments, this ratio r may be characterized by an analytic method. The analytic method gives a signal response of intensity $I_N^0$ for a unit amount of nitrogen atom and a signal response of intensity $I_{Hf}^0$ for a unit amount of Hf. Accordingly, the ratio r may be expressed in terms of measured signal $I_N$ and measured intensity $I_{Hf}$ using the following formula:

$$r = r_I * I_{Hf}^0 / I_N^0 = I_N / I_{Hf} * I_{Hf}^0 / I_N^0$$

Figure 24:
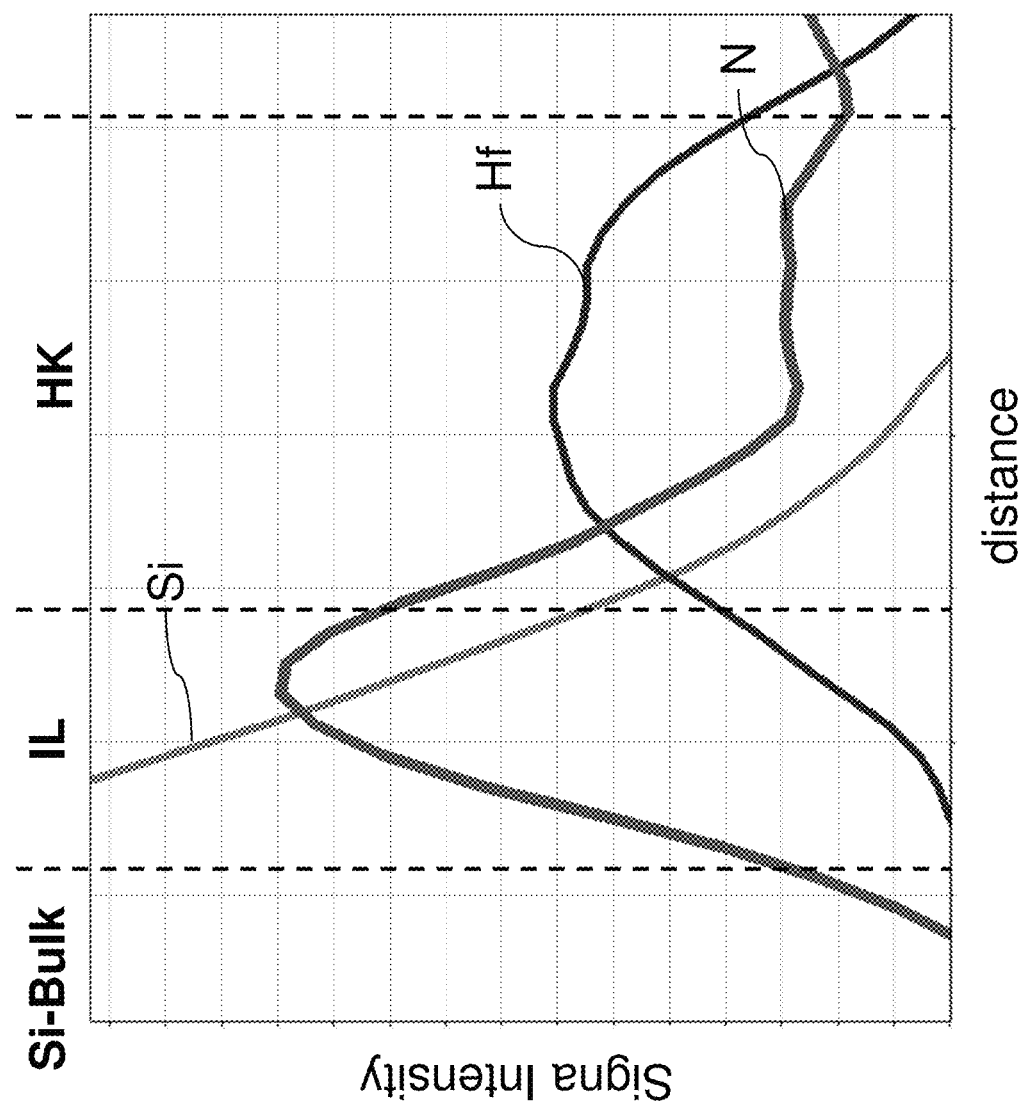
FIG. 24 is an example diagram correlating analytic signal intensity of various elements of the layers of the IC device with their respective distribution across the layers, according to various aspects of the present disclosure.

In some embodiments, the analytic method may be electron microscopy, for example, transmission electron microscopy (TEM). A schematic diagram for a typical TEM analysis is illustrated in FIG. 24. The ratio $r_I = I_N / I_{Hf}$, measured with TEM at the interface 240, is about 0.5 to about 1.3. As described above, if the ratio is too low, such as less than 0.5, there may be insufficient amount of nitrogen incorporated to minimize the leakage current in the n-type devices; while if the ratio is too high, such as greater than 1.3, properties of the p-type devices may be compromised. The interface 240, as designated here, is defined as the surface on which the molar concentration of the interfacial layer material and the molar concentration of the gate electric material are the same (for example, both at 50%). Alternatively, the ratio $r_I$ may be measured using any other analytic method when properly calibrated to indicate the atomic concentrations. Moreover, as illustrated in FIG. 24, the concentration of nitrogen atom in a region of the interfacial layers 112 adjacent the interface 240 (such as at the cross-section 260) is greater than the concentration of the nitrogen atom at the interface 240.

Figure 5A:
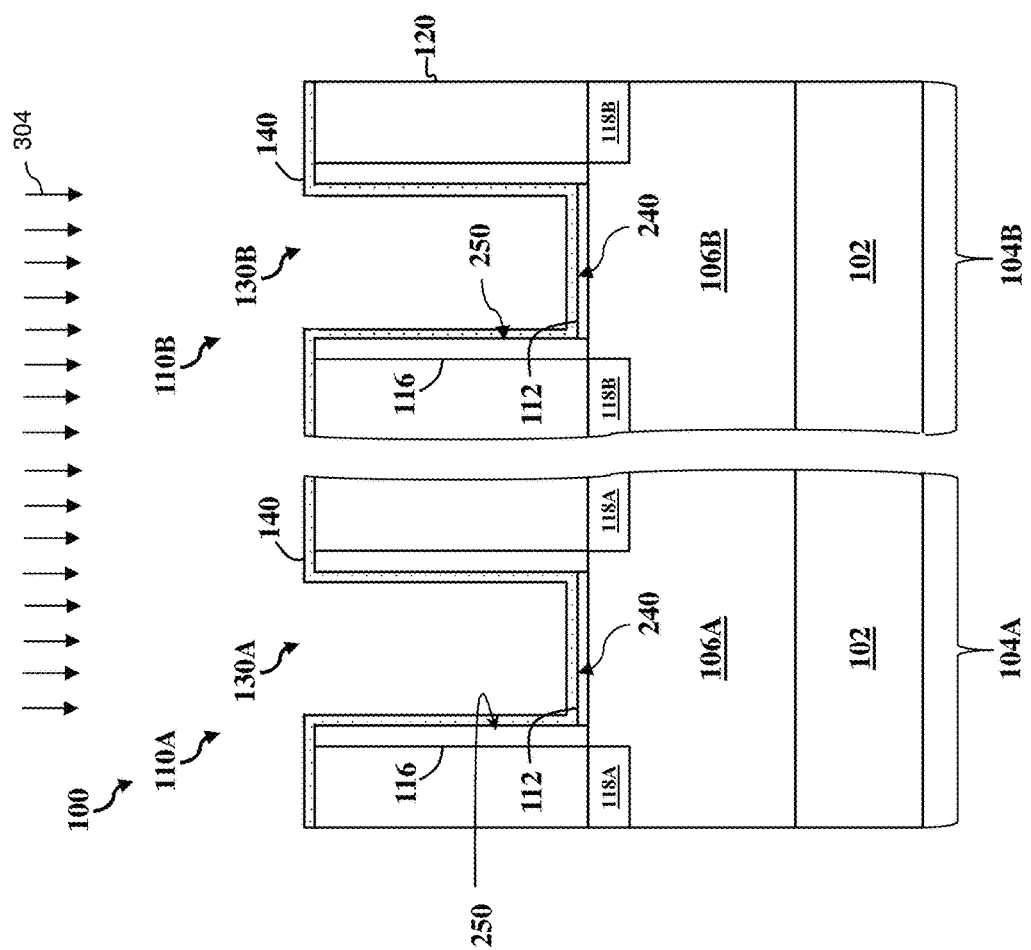
Figure 5B:
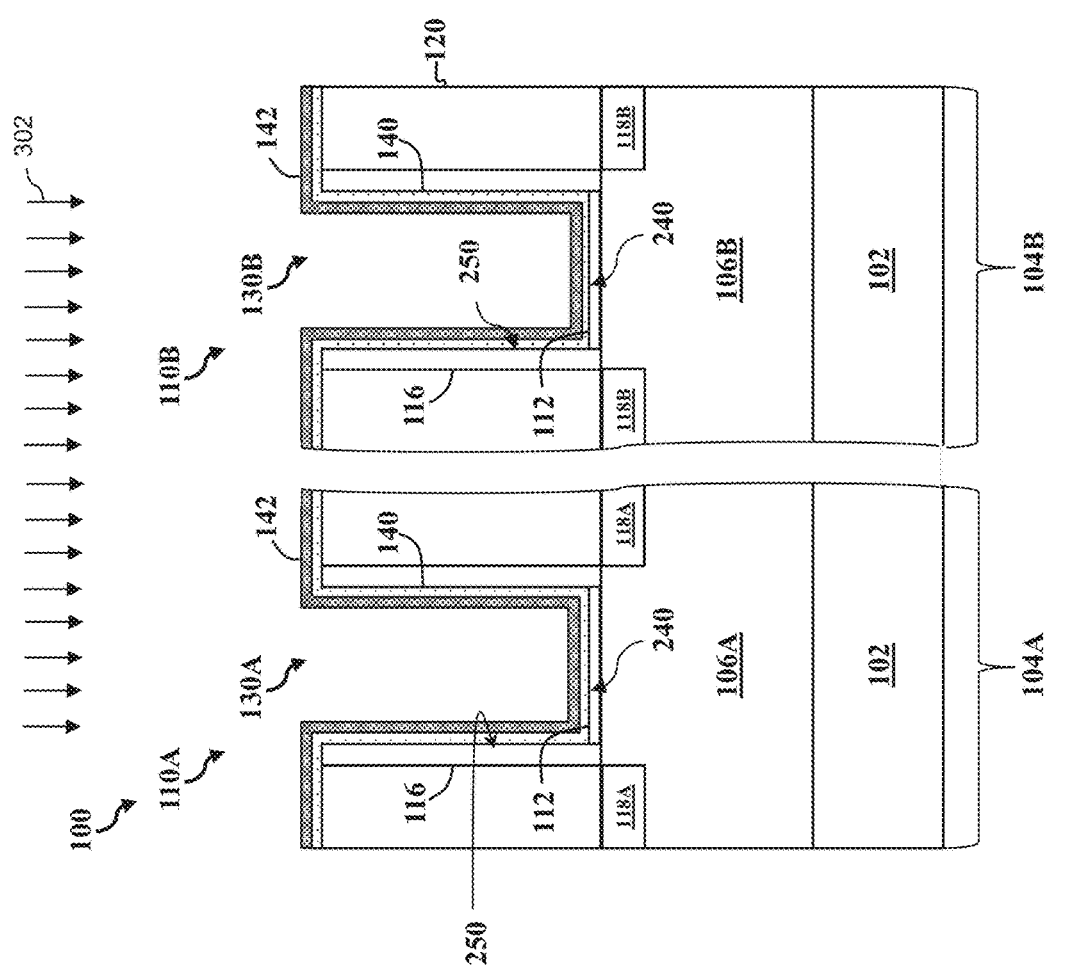
Figure 5C:
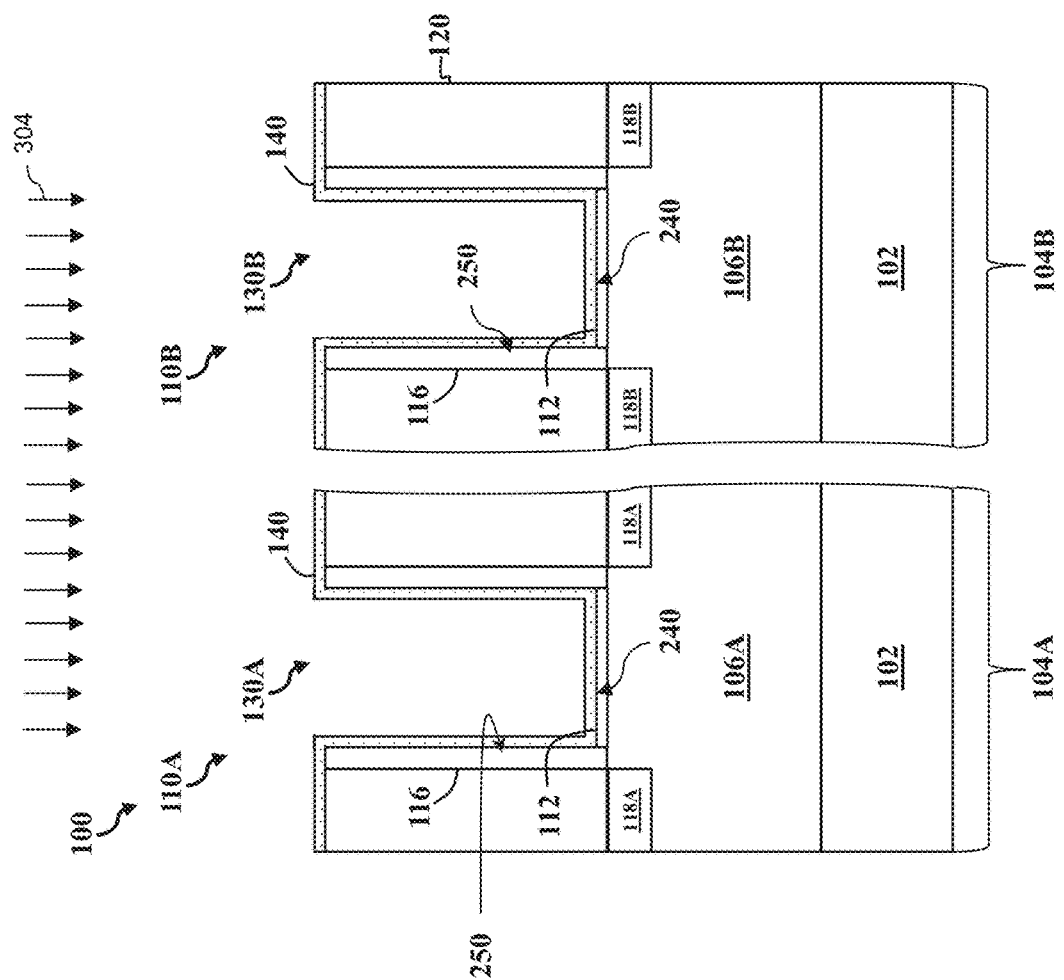
Figure 5D:
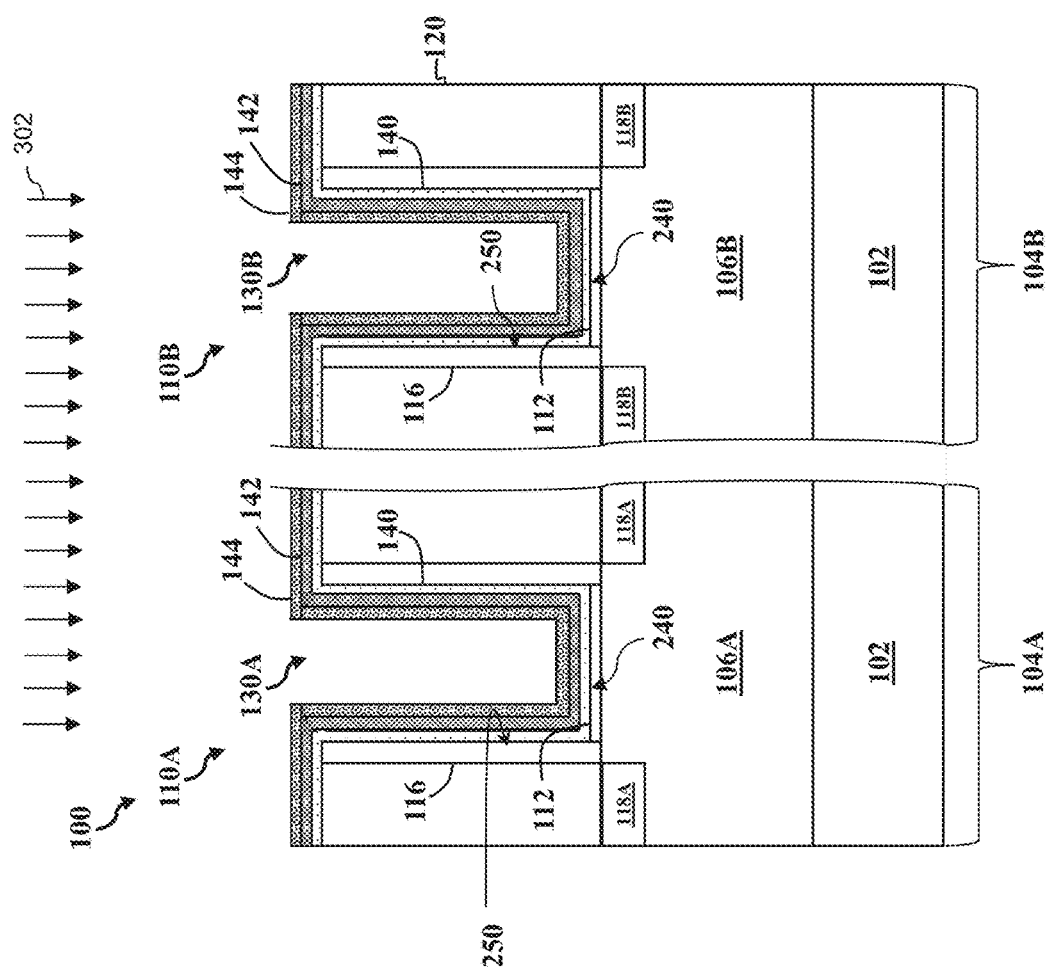
Figure 5E:
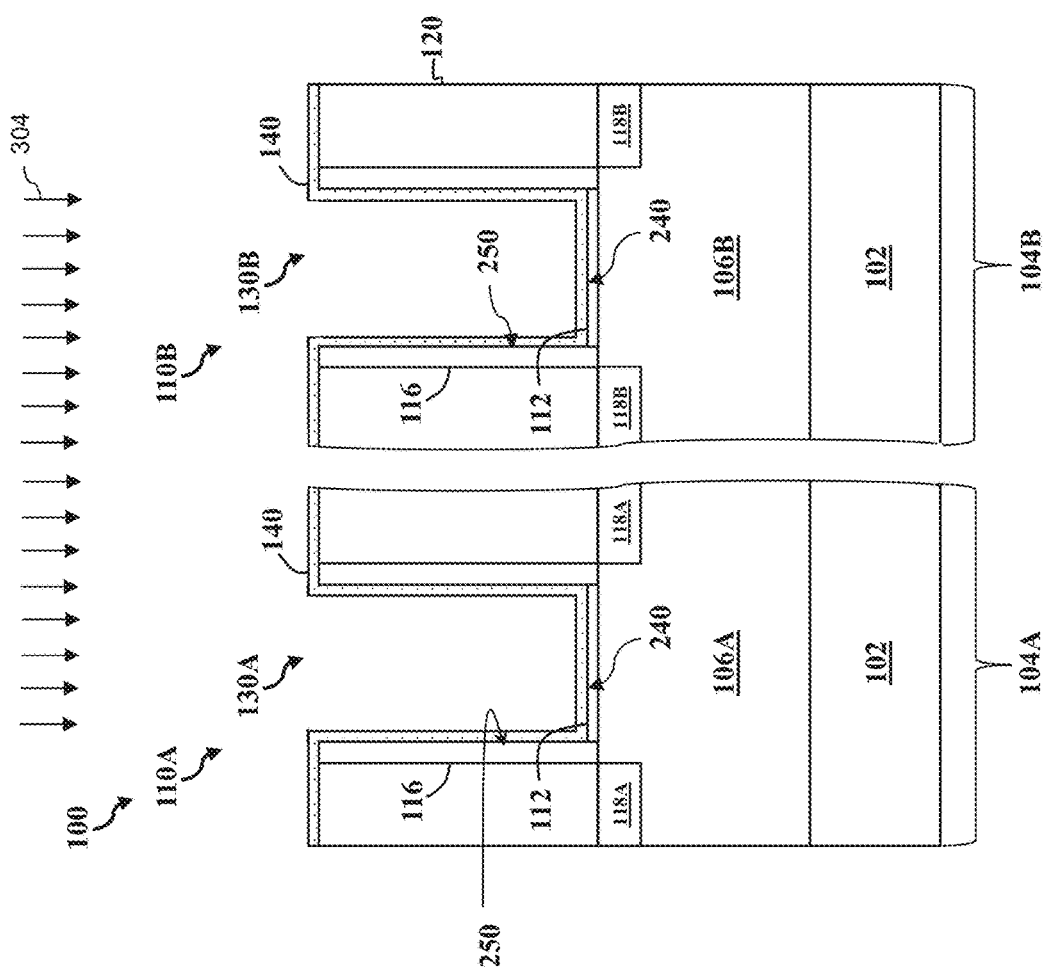

FIG. 5A illustrates one approach for passivating the gate dielectric layer 140. Following the conclusion of the annealing operation 304, the method 10 proceeds to block 22 of FIG. 1A for further processing, which will be described in detail later. Alternatively, in a second approach for passivating the gate dielectric layer 140, the method portion 200 first forms a capping layer 142 at block 204 of FIG. 1B. This is illustrated in FIG. 5B. In many embodiments, the capping layer 142 is provided to limit excessive regrowth of the interfacial layers 112 that would result in a thicker equivalent oxide thickness (or EOT). The capping layer 142 may include one or more conductive materials, such as titanium nitride (TiN), titanium silicon nitride (TiSiN), tantalum silicon nitride (TaSiN), tantalum nitride (TaN), tantalum carbide (TaC), tantalum carbide nitride (TaCN), tungsten carbonitride (WCN), titanium aluminum nitride (TiAlN), silicon (Si), other suitable metal materials, or combinations thereof. Any suitable depositions may be used, such as ALD, CVD, PVD, HDPCVD, MOCVD, RPCVD, PECVD, LPCVD, ALCVD, APCVD, spin coating, plating, other deposition process, or combinations thereof. In some implementations, the capping layer 142 is conformally deposited over the gate dielectric layer by ALD, such that capping layer 142 has a substantially uniform thickness and partially fills openings 130A and 130B.

Still referring to FIG. 5B, the second approach proceeds to block 208 of FIG. 1B. The workpiece 100 is subject to an annealing operation 302. The annealing operation 302 differs from the previously described annealing operation 304 in several aspects. For example, the annealing operation 302 implements an inert gas (such as argon (Ar), nitrogen ($N_2$), other suitable inert gases, or combinations thereof). In other words, the annealing atmosphere does not include active nitrogen. Moreover, in some embodiments, the annealing operation 302 implements a soak temperature greater than about 500° C., a soak time duration greater than 5 seconds, a soak pressure greater than 1 Torr, and a spike temperature greater than 800° C. Without being limited by theory, no active nitrogen passivation (such as that described above for the annealing operation 304) occurs under such conditions due to the lack of active species. Rather, the annealing operation 302 improves the quality of the gate dielectric layer 140 by inducing local reorganization of atoms into more energy-favorable states, so as to reduce the amount of local defects (such as oxygen defects) present in the lattices of the gate dielectric layer 140 that may adversely affect device characteristics. If the soak temperature is less than about 500° C., the soak time duration is less than about 5 seconds, the soak pressure is less than about 1 Torr, and/or the spike temperature is less than 800° C., the thermal energy required for the effect reorganization and defect amendment may not be sufficient to bring substantial improvements. Turning to block 212 of FIG. 1B and to FIG. 5C, the second approach proceeds to remove the capping layer 142 after the annealing operation 202 is completed. Accordingly, the top and sidewall surfaces of the gate dielectric layer 140 are again exposed in the openings 130A, 130B. The removal of the capping layer 142 may implement any suitable methods, such as a dry etching or a wet etching method (for example, using a wet etchant such as HF).

Subsequently, at block 214, an annealing operation 304 is conducted on the workpiece 100. The annealing operation 304 implements parameters similar to those described above for the annealing operation 304 of FIG. 5A. For example, the annealing operation 304 may implement an annealing atmosphere that includes active nitrogen (such as ammonia nitrogen). Moreover, the annealing operation 304 may include annealing at a soak temperature of about 520° C. to about 590° C. for a time duration of about 5 seconds to about 30 seconds and at a soak pressure at about 1 Torr to about 20 Torr. Furthermore, the annealing operation includes a spike annealing step at a temperature greater than about 800° C. before cooling down to room temperature. For example, the spike annealing temperature may be about 800° C. to 900° C. In some embodiments, the annealing operation 304 is configured to achieve a proper nitrogen concentration and distribution similar to that described above with respect to FIG. 5A. In other words, when measured with TEM, the ratio $r_I = I_N / I_{Hf}$ for the interface 240 is about 0.5 to about 1.3. Moreover, the concentration of nitrogen atom in a region of the interfacial layers 112 adjacent the interface 240 (such as at the cross-section 260) is greater than the concentration of the nitrogen atom at the interface 240. In some other approaches, the annealing operation 304 is conducted without removing the capping layer 142. In some embodiments, the presence of the capping layer 142 impedes the reaction between the active nitrogen and the gate dielectric layer 140, and leads to reduced efficacy in passivating the gate dielectric layer 140. Accordingly, the amount of nitrogen incorporated into the gate dielectric layer 140 may be less than desired.

As described above, a third approach may alternatively be used. The third approach generally resembles the second approach, with the exception that more than one capping layer is formed prior to the annealing operation 302. For example, turning to block 206 of FIG. 1B and to FIG. 5D, following the formation of the capping layer 142 and before the annealing operation 302, a second capping layer 144 is formed on the capping layer 142. Accordingly, the annealing operation 302 is conducted on the device over the capping layer 144 and capping layer 142. In some embodiments, the capping layer 144 prevents the capping layer 142 from absorbing oxygen and forming excessive oxide that would degrade performance of the device 100. In some embodiments, the capping layer 144 may be conformally deposited over the capping layer 142 using a suitable deposition process, such as ALD, CVD, PVD, HDPCVD, MOCVD, RPCVD, PECVD, LPCVD, ALCVD, APCVD, spin coating, plating, other deposition process, or combinations thereof. In some embodiments, the capping layer 144 may include silicon. After the annealing operation 302, the method portion 200 proceeds to remove the second capping layer at block 210 as well as the first capping layer at block 212 of FIG. 1B, using any suitable methods. As described above, the removal of the capping layers 142 and 144 allows better interaction between the active nitrogen and the gate dielectric layer 140, such that the gate dielectric layer is properly passivated in subsequent processing. At this stage, the top and sidewall surfaces of the gate dielectric layer 140 are once again exposed in the openings 130A and 130B. Turning to block 214 of FIG. 1B, the method portion 200 proceeds to perform the annealing operation 304 using an active nitrogen atmosphere to achieve the desired nitrogen concentration and profile. For example, referring to FIG. 5E, the annealing operation 304 is conducted such that the exposed gate dielectric layer 140 directly interact with the active nitrogen in the annealing atmosphere thereby causing passivation to the gate dielectric layer 140, as well as the incorporation of proper nitrogen atoms at the proper concentration.

Turning back to block 22 of FIG. 1A and to FIGS. 6-11, gate electrodes are formed on the passivated gate dielectric layer in the openings 130A, 130B. As described above, the p-type region 104A and the n-type region 104B are configured to form n-type device and p-type device, respectively. Accordingly, the gate electrode formed in the opening 130A may be different from the gate electrode formed in the opening 130B. Any suitable methods may be implemented to form the gate electrodes. FIGS. 6-11 provide one such example method and are described in detail below.

Figure 6:
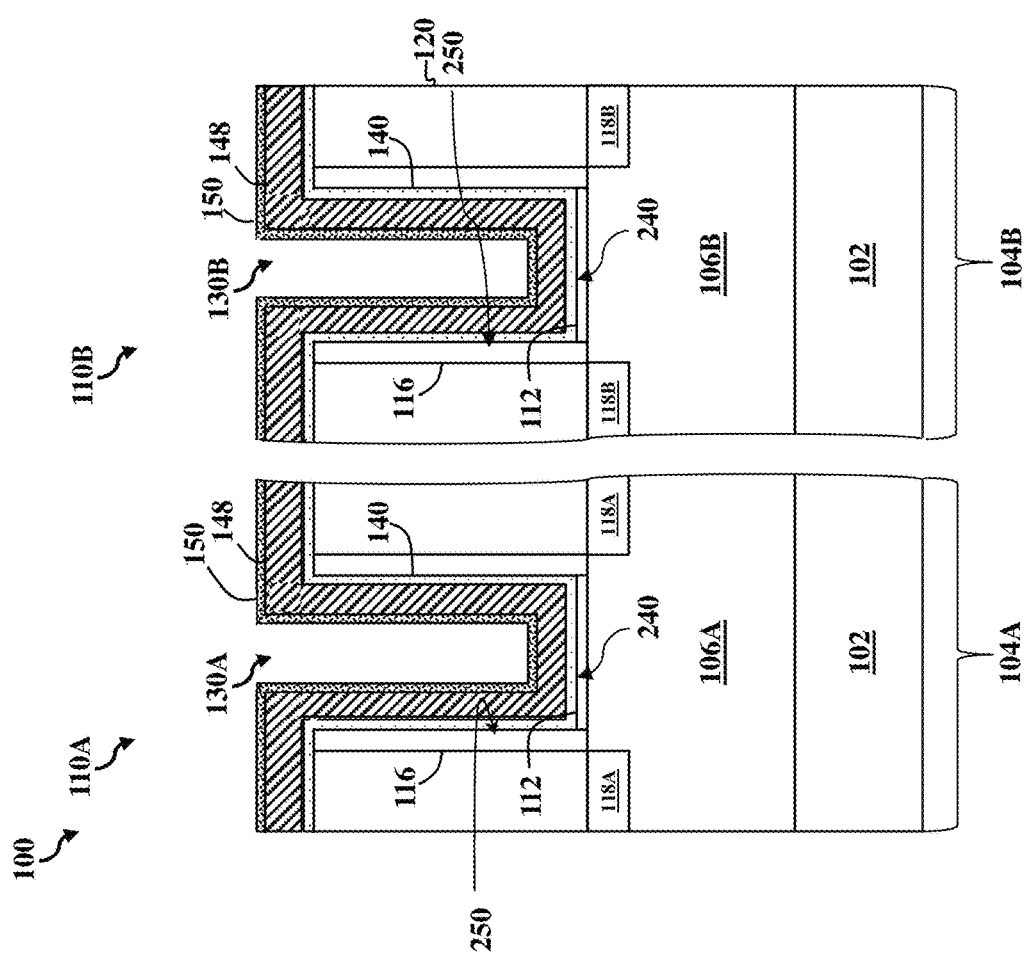

Referring to FIG. 6, processing continues to form an n-type work function layer 148 in the opening 130A, 130B over the gate dielectric layer 140. The n-type work function layer 148 includes n-type work function materials, for example, Ti, Al, Ag, Mn, Zr, TiAl, TiAlC, TaC, TaCN, TaSiN, TaAl, TaAlC, TiAlN, other n-type work function material, or combinations thereof. The n-type work function layer 148 may be formed by any suitable deposition process, such as ALD, CVD, PVD, HDPCVD, MOCVD, RPCVD, PECVD, LPCVD, ALCVD, APCVD, spin coating, plating, other deposition process, or combinations thereof. In one implementation, the n-type work function layer 148 may be conformally deposited in-situ over the gate dielectric layer 140, such that the n-type work function layer 148 has a substantially uniform thickness and partially fills opening 130A and opening 130B. The layer 148 may have a thickness of about 10 Å to about 20 Å. In the depicted embodiments, the n-type work function layer 148 directly contacts the passivated gate dielectric layer 140. As described above, the passivated gate dielectric layer 140 includes nitrogen atoms at its top and sidewall surfaces. Accordingly, the interface between the n-type work function layer 148 and the gate dielectric layer includes nitrogen atoms.

Moreover, a capping layer 150 is deposited over the n-type work function layer 148 to, for example, provide protection against oxidative degradations. In some implementations, the capping layer 150 is one single layer with a uniform material. Exemplary materials for the capping layer 150 include TiN, TaN, WN, WCN, TiSiN, and/or TaSiN. In some other implementations, the capping layer 150 includes more than one sub-layers, each including different materials. For example (not shown), the capping layer 150 includes one sub-layer comprising TiN, TaN, WN, WCN, TiSiN, and/or TaSiN, and another sub-layer comprising aluminum oxide ($Al_2O_3$), silicon oxide ($SiO_2$), and/or germanium oxide ($GeO_2$). The capping layer 150 may have a thickness of about 5 Å to about 15 Å. The combination of two sub-layers, in some circumstances, provides superior protection to the underlying n-type work function layer 148 from being oxidized than either sub-layer alone at the same total thickness. The capping layer 150 (or the sub-layers) may be formed by any appropriate methods. For example, the capping layer 150 may be conformally deposited over the n-type work function layer 148 by an ALD process. Alternatively, the capping layer 150 may be formed using another suitable deposition process, such as CVD, PVD, HDPCVD, MOCVD, RPCVD, PECVD, LPCVD, ALCVD, APCVD, spin coating, plating, other deposition process, or combinations thereof.

Figure 7:
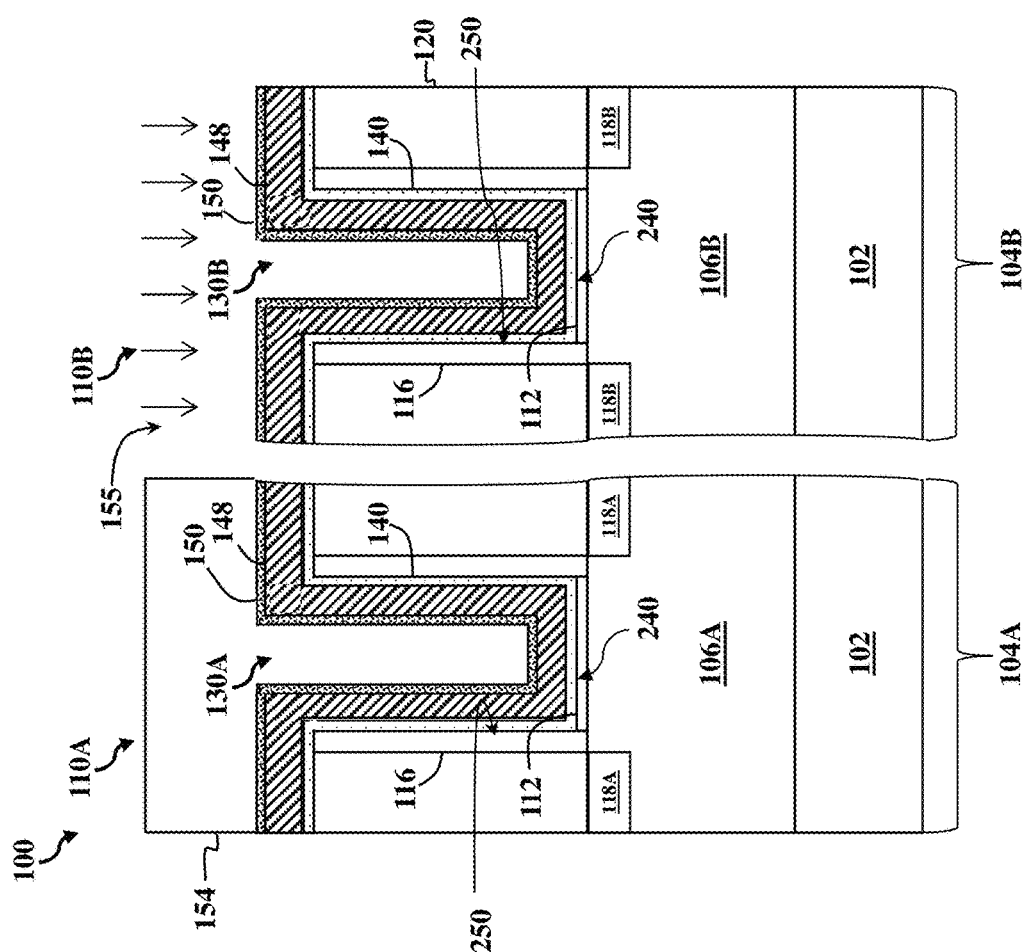
Figure 8:
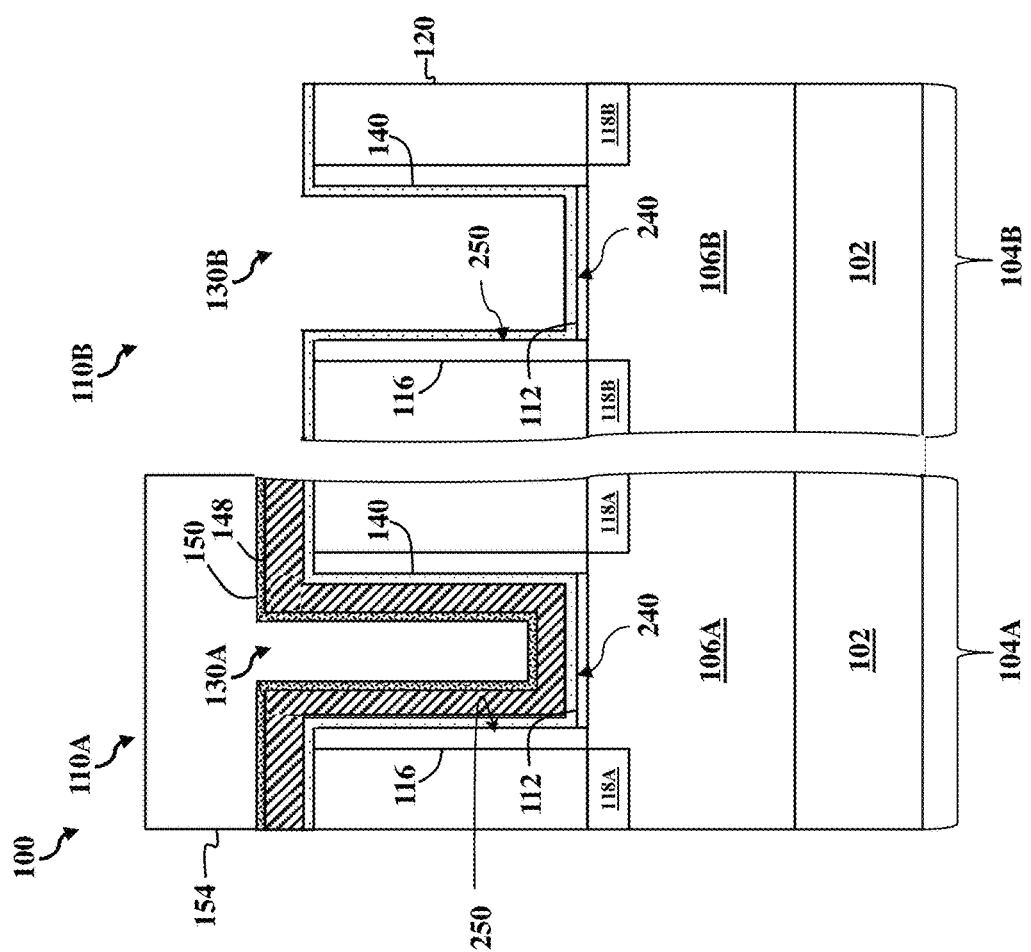
Figure 9:
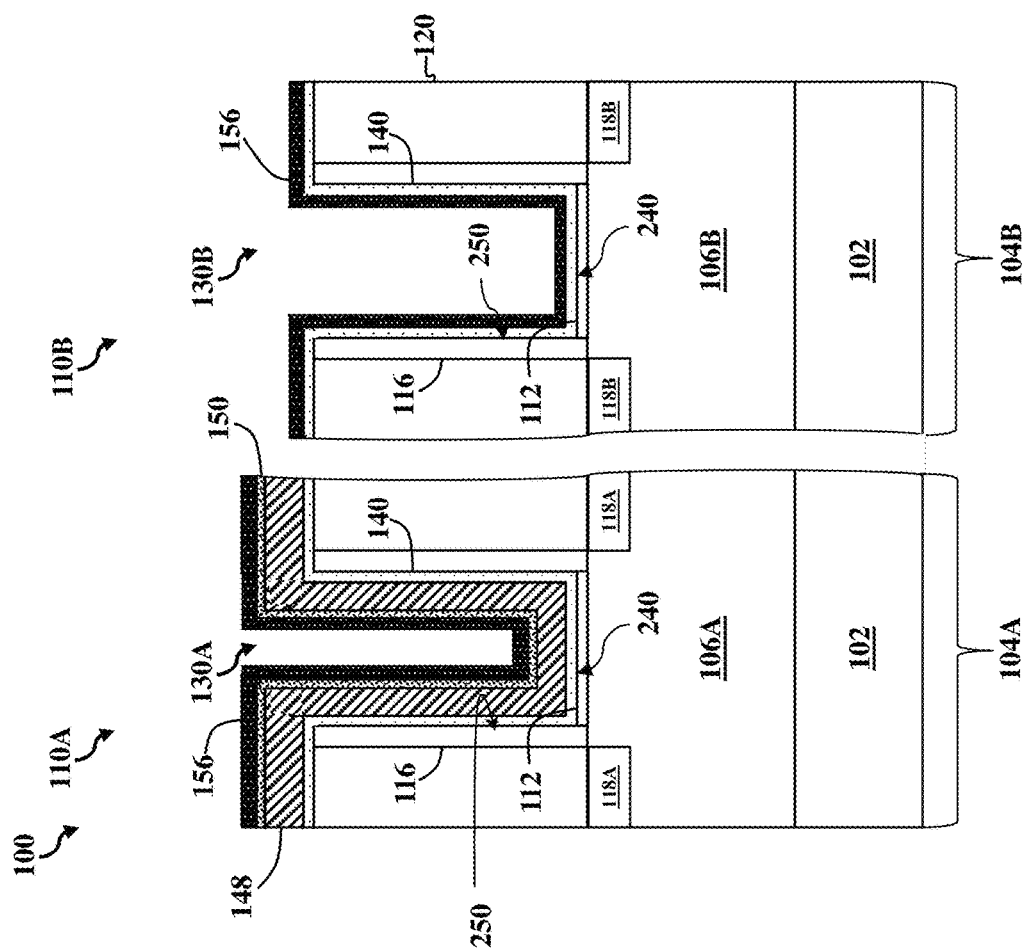

Processing continues to conduct photolithography to form appropriate patterns. Turning to FIG. 7, a patterned masking layer 154 is formed over workpiece 100. Patterned masking layer 154 covers the p-type region 104A and has one or more openings 155 that expose the n-type region 104B. Patterned masking layer 154 is formed by any suitable process, including the deposition processes, lithography processes, and/or etching process described herein. In some implementations, patterned masking layer 154 includes a material having different etching characteristics from those of the capping layer 150 (or the sub-layers), and the n-type work function layer 148. In some implementations, patterned masking layer 154 includes a resist material, and thus may be referred to as a patterned resist layer and/or a patterned photoresist layer. In other implementations, other suitable materials may be employed instead. At this processing stage, the capping layer 150 (or the sub-layers) and the n-type work function layer 148 are removed from the n-type region 104B in an etching operation 155. Accordingly, turning to FIG. 8, the gate dielectric layer 140 becomes exposed in n-type device region 104B and in the opening 130B. Meanwhile, the gate dielectric layer 148, along with the overlaying capping layer 150 remain unaffected by the etching operation. Subsequently, the patterned masking layer 154 is removed, such that the capping layer 150 is exposed in the openings 130A in the p-type region 104A.

Figure 10:
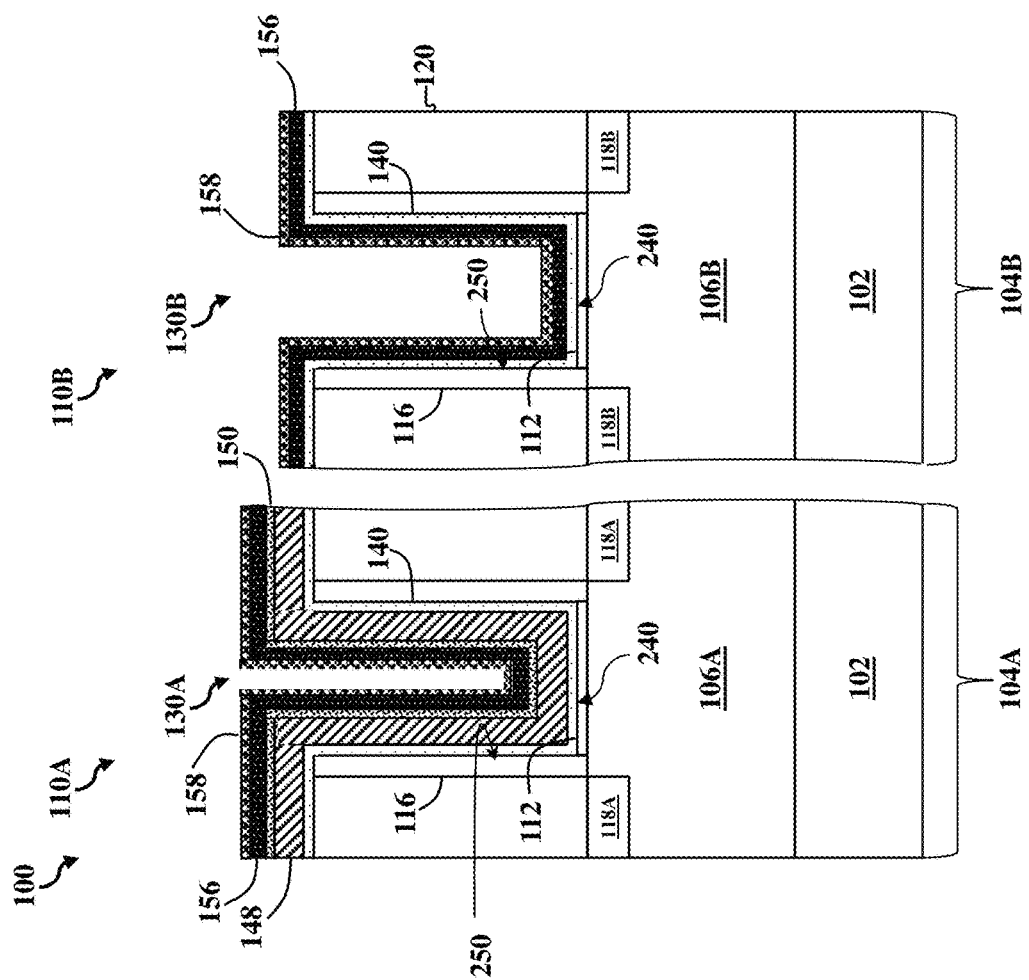

Turning to FIG. 10, processing continues to form a p-type work function layer in both the openings 130A and 130B. In some embodiments, the p-type work function layer 156 is conformally deposited such that p-type work function layer 156 has a substantially uniform thickness and partially fills openings 130A and 130B. In some implementations, p-type work function layer 156 has a step coverage of more than 99% of the surface. The p-type work function layer 156 includes a p-type work function material, for example, TiN, TaN, Ru, Ir, Mo, Al, RuO$_2$, IrO$_2$, WN, ZrSi2, MoSi$_2$, TaSi$_2$, NiSi$_2$, WN, other p-type work function material, or combinations thereof. In the depicted embodiment, a p-type work function layer 156 is formed over the capping layer 150 in the p-type region 104A, and over the gate dielectric layer 140 in the n-type region 104B, such that the p-type work function layer 156 directly contacts the gate dielectric layer 140 in the n-type region 104B. In the depicted embodiment, the processing further optionally includes forming a capping layer 158 in-situ over the p-type work function layer 156. For example, a capping layer 158 is conformally deposited the over the p-type work function layer 156 by an ALD process, such that the capping layer 158 has a substantially uniform thickness and partially fills openings 130A and 130B. Exemplary materials for the capping layer 158 include TiN, TaN, WN, WCN, TiSiN, and/or TaSiN. Alternatively, the capping layer 158 may be formed using another suitable deposition process, such as CVD, PVD, HDPCVD, MOCVD, RPCVD, PECVD, LPCVD, ALCVD, APCVD, spin coating, plating, other deposition process, or combinations thereof.

Figure 11:
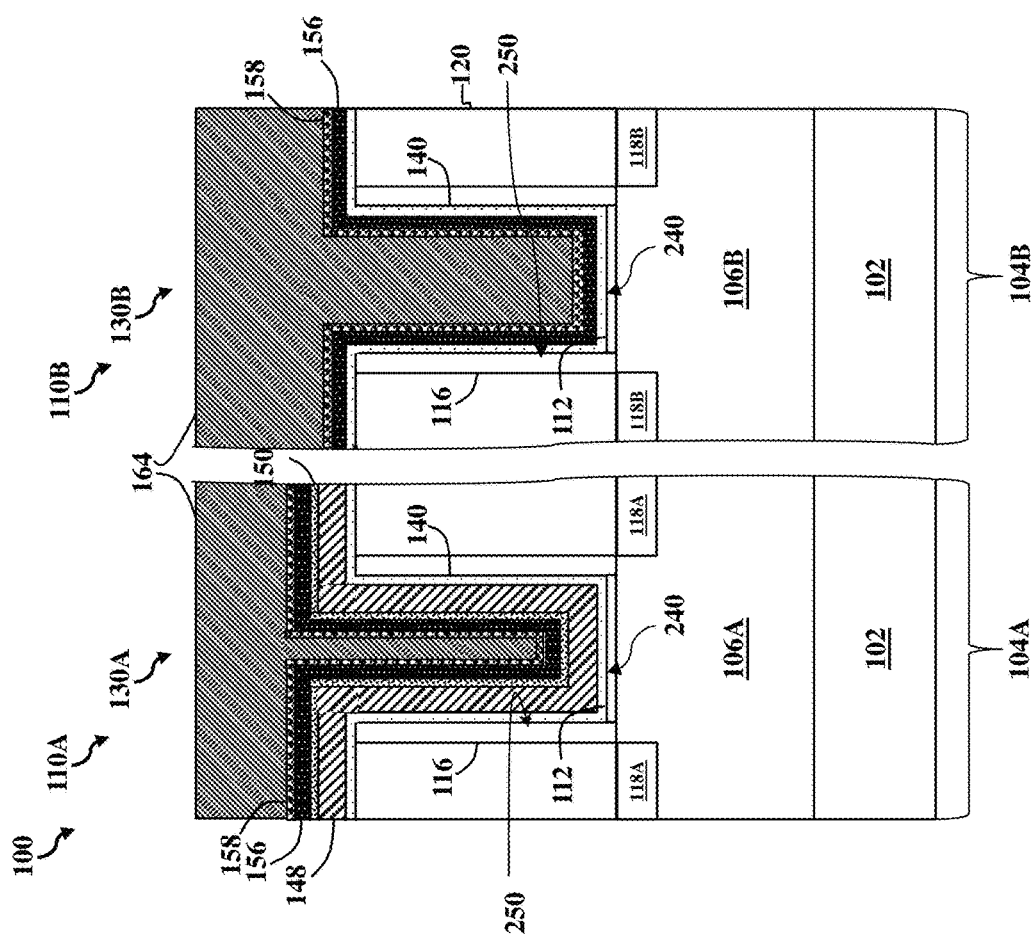

Turning to FIG. 11, processing continues to fill the openings 130A and 130B with a metal fill (or bulk) layer 164. The metal fill layer 164 includes a suitable conductive material, such as Co, Al, W, and/or Cu, and may be formed by any suitable methods. In some implementations, metal fill layer 164 has a thickness of about 1,500 Å to about 3,000 Å. Metal fill layer 164 may additionally or collectively include other metals, metal oxides, metal nitrides, other suitable materials, or combinations thereof. Alternatively, metal fill layer 164 is formed using another suitable deposition process, such as PVD, HDPCVD, MOCVD, RPCVD, PECVD, LPCVD, ALCVD, APCVD, spin coating, plating, other deposition process, or combinations thereof.

Figure 12:
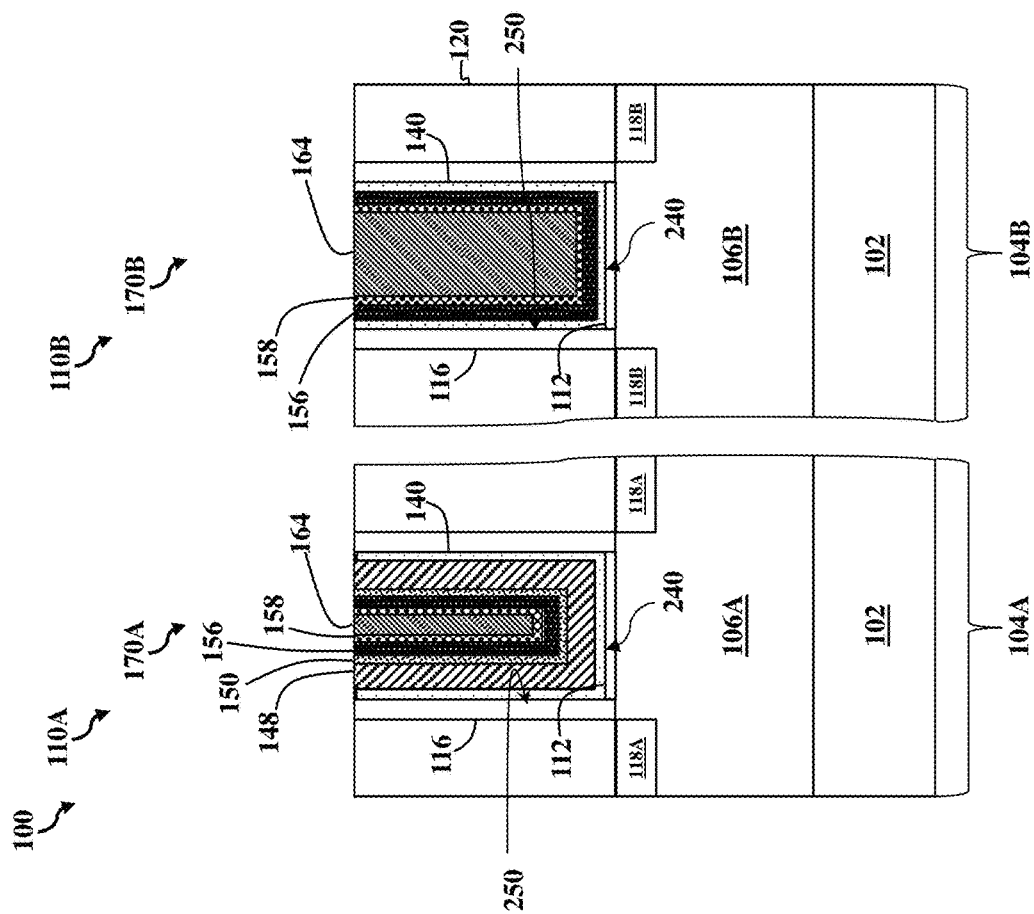

Turning to FIG. 12, a planarization process is performed to remove excess gate materials from workpiece 100. For example, a CMP process is performed until a top surface of ILD layer 120 is reached (exposed). In the depicted embodiment, top surfaces of gate structures 110A and 110B are substantially planar with a top surface of ILD layer 120 after the CMP process. At this processing stage, the gate structures 110A are 110B are formed in the respective openings 130A and 130B. The gate structure 110A includes the interfacial layer 112, the gate dielectric layer 140, and a gate electrode layer 170A. The gate electrode layer 170A includes the n-type work function layer 148, the capping layer 150, the p-type work function layer 156, the capping layer 158, and a metal fill layer 164. Meanwhile, the gate structure 110B includes the interfacial layer 112, the gate dielectric layer 140 and a gate electrode layer 170B. The gate electrode layer 170B includes the p-type work function layer 156, the capping layer 158, and the metal fill layer 164. In some embodiments, the gate electrode 170A, 170B may implement alternative configurations. For example, the p-type work function layer 156 and the capping layer 158 may be removed from the p-type region 104A. Regardless of specific configurations and/or fabrication methods, the gate electrode 170A, 170B each directly contacts the respective gate dielectric layer 140 underlying therebeneath. For example, the n-type work function layer 148 and the p-type work function layer 156 each directly contacts the gate dielectric layer 140.

Figure 13:
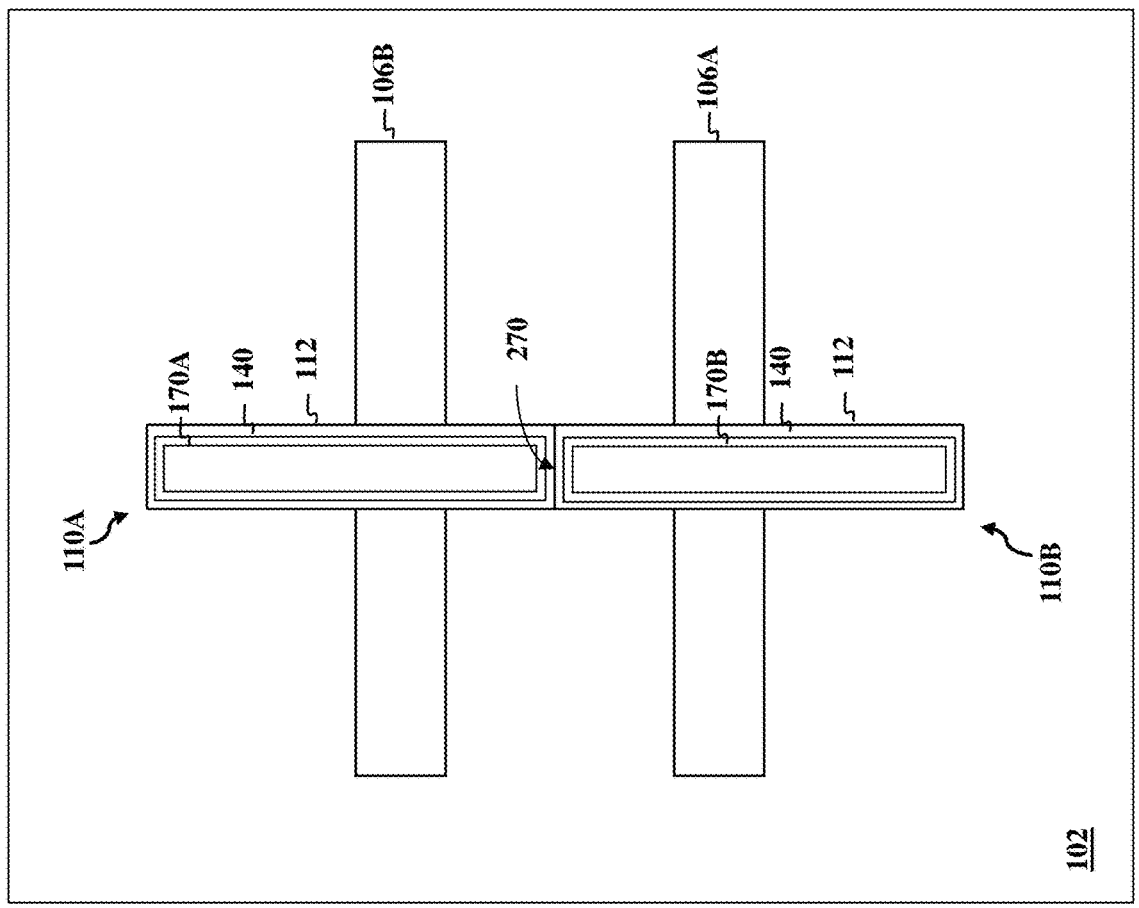
Figure 14:
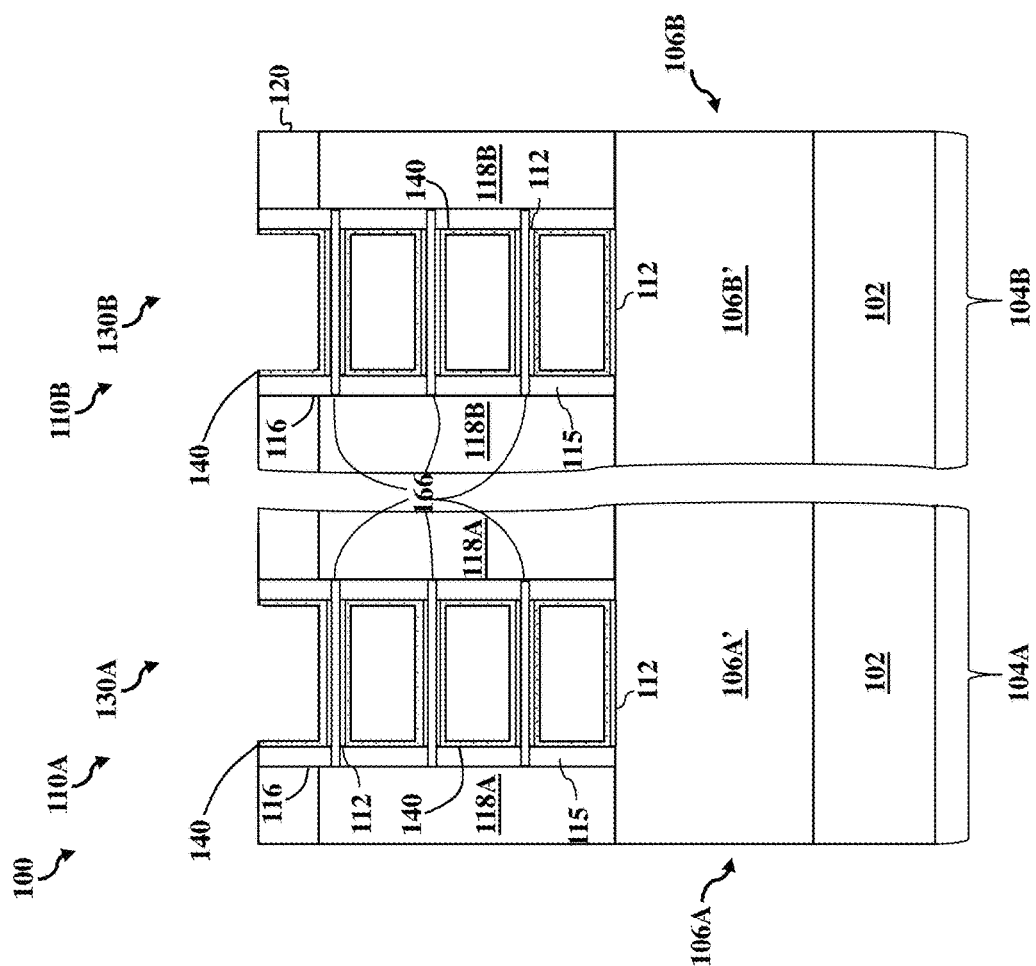

Turning to FIG. 13, embodiments of the present disclosure also improves other device characteristics. For example, in some embodiments (such as in CMOS devices), the gate structures 110A and 110B directly interface each other. Because the gate structures 110A and 110B include different gate electrode materials, there exists a material interface 270 between gate structures 110A and 110B. During the operation lifetime of the device 100, the different gate electrode materials, such as work function metals (e.g. aluminum) may diffuse across the material interface 270. Since the gate structures 110A and 110B are configured for n-FinFET and p-FinFET respectively and operate independently, such material diffusions at the interface 270 may cause a concern. For example, such diffusions may cause contaminations to the gate electrode layers (or adjacent auxiliary layers) thereby affecting the threshold voltages of the n-FinFET and p-FinFET. In some instances, the threshold voltage of the p-type FinFET of the device 100 may be shifted to a higher value compared to a situation without such boundary diffusions. This effect is referred to as the boundary effect or metal boundary effect (MBE). In scaled-down devices, the boundary effect is exacerbated due to the reduced diffusion paths.

As illustrated in FIG. 13, the diffusion path of the contaminants crosses the gate dielectric layer 140 at the interface 270. In some embodiments, the implementation of the annealing operation 304 as provided herein further reduces the migration rate of contaminants (such as aluminum) at the various material interfaces such that the diffusion across the interface 270 is reduced. For example, the diffusion may be impeded at the interface between the gate electrode 170A, 170B and the gate dielectric layer 140, throughout the gate dielectric layer 140, and/or at the interface 240 between the gate dielectric layer 140 and the interfacial layer 112. In some embodiments, the MBE effect is reduced (or improved), as compared to without implementing the methods provided herein, by about 5 mV to about 15 mV. Consequently, threshold voltage variation (e.g. Vt-sigma) is reduced (or improved) by about 0.5 mV to about 2.0 mV. As a result, the read and write margin is accordingly improved by about 1% to about 5%, and Vmin is improved by about 25 mV to about 50 mV. Such improvements boost the device performance and/or reliability.

As discussed above, the various methods for forming gate stacks and related gate structures disclosed herein may be implemented in any of a variety of device types. For example, aspects of the present disclosure may be implemented to form gate stacks suitable for nano-sheet-based devices. A nano-sheet-based device includes any device that has a plurality of suspended gate channel layers stacked together to form the gate structure. Nano-sheet-based devices include gate-all-around (GAA) devices, multi-bridge-channel (MBC) devices, and other similar devices. Furthermore, the nano-sheet-based devices may include gate channel layers of any suitable shapes and/or configurations. For example, the gate channel layers may be in one of many different shapes, such as wire (or nanowire), sheet (or nanosheet), bar (or nano-bar), and/or other suitable shapes. In other words, the term nano-sheet-based devices broadly encompasses devices having gate channel layers in nanowire, nano-bars, and any other suitable shapes. Further, the gate channel layers of the nano-sheet-based devices may engage with a single, contiguous gate structure, or multiple gate structures.

In a nano-sheet-based device, a channel region of a single device may include multiple layers of semiconductor material physically separated from one another. In some embodiments, a gate of the device is disposed above, alongside, and even between the semiconductor layers of the device. This configuration may place more semiconductor material proximate to the gate and thereby improve the control of carriers through the channel region. Thus, nano-sheet-based devices allow more aggressive gate length scaling for both performance and density improvement over typical FinFET devices. On the other hand, the scaling also cause processing and/or performance issues in nano-sheet-based devices. For example, due to the reduced thicknesses of the interfacial layers 112 and/or the gate dielectric layer 140, the migration path for charge carriers through those layers is much shorter, such that the leakage current becomes higher. In that regard, the method described herein are particularly beneficial to nano-sheet-based devices due to the ability to reduce the leakage current without compromising performances.

FIGS. 14-23 are diagrammatic fragmentary cross-sectional side views of a nano-sheet-based device 100, in portion or entirety, at various fabrication stages (such as those associated with method 10 in FIG. 1A) according to various aspects of the present disclosure. In other words, FIGS. 14-23 illustrate a special situation of what has already been described in FIGS. 2-12. Accordingly, the reference numerals and/or letters are repeated to show the same or similar components as those described above; and some descriptions of the same or similar components in FIGS. 14-20 are abbreviated or omitted for the sake of clarity.

As illustrated in FIG. 14, an initial structure for the fin-based IC device 100 includes a substrate 102, and fin structures 106A and 106B formed on the substrate 102. The fin structures 106A, 106B each include a base fin 106A', 106B', respectively, and a stack of semiconductor layers 166 suspended over the respective base fin 106A', 106B'. The semiconductor layers 166 are separated from each other forming gate openings 130A, 130B over and between adjacent semiconductor layers 166. Because the semiconductor layers 166 form channels in the subsequently formed devices, semiconductor layers 166 are interchangeably referred to as channel layers 166. Moreover, the initial structure for the device 100 includes inner spacers 115 on two sides of the gate openings 130A, 130B and between vertically adjacent semiconductor layers 166, as well as gate spacers 116 on the top surfaces of the topmost semiconductor layers 166. Furthermore, source/drain features 118A, 118B are formed on both sides of the suspended semiconductor layers 166 such that charge carriers may flow between the source/drain features 118A and between the source/drain features 118B through the semiconductor layers 166 during operation. Additional descriptions of a nano-sheet-based device structure and the method of forming a nano-sheet-based device structure may be found in other related patents, for example, U.S. Pat. No. 9,754,840, filed on Nov. 16, 2015, and entitled "Horizontal Gate-All-Around Device Having Wrapped-Around Source And Drain", the content of which is hereby incorporated by reference in its entirety. Those descriptions may be referenced to in understanding the present embodiments.

Still referring to FIG. 14, an interfacial layer 112 is formed conformally on each of the suspended semiconductor layers 166. Moreover, a gate dielectric layer 140 is conformally formed over each of the interfacial layers 112 and on sidewall surfaces of the gate spacers 116 and sidewall surfaces of the inner spacers 115. The interfacial layers 112 and the gate dielectric layers 140 are formed using similar methods and materials as those described above with respect to FIG. 3 and FIG. 4. In the depicted embodiments, the gate dielectric layer 140 interfaces with the interfacial layers 112 on horizontal surfaces, such as on interfaces 240. Moreover, the gate dielectric layer 140 interfaces with inner spacers 115 on the vertical (or sidewall surfaces) 250.

Figure 15:
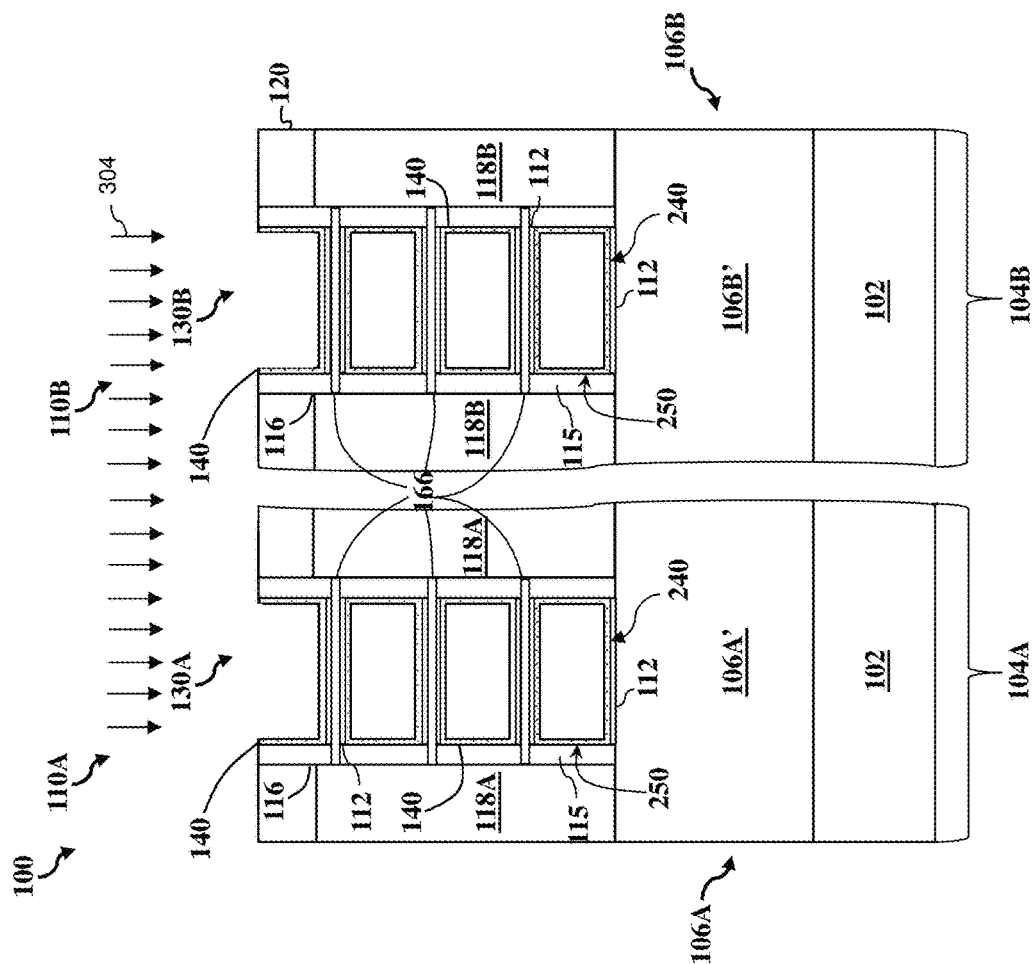

Turning to FIG. 15, the workpiece 100 is subject to an annealing operation 304. The annealing operation 304 may be similar to those described above with respect to FIG. 5A. For example, the annealing operation implements an ambient that includes active nitrogen, such as ammonia gas. For example, the annealing operation 304 includes a soak phase as a soak temperature of about 520° C. to about 590° C. for a time duration of about 5 seconds to about 30 seconds, and a spike annealing phase at a temperature of about 800° C. to 900° C. As described above, the annealing operation 304 causes reaction between the gate dielectric layer 140 and the active nitrogen, thereby passivating the gate dielectric layer 140. This embodiment of the present disclosure resembles the first approach described above with respect to FIG. 5A. Accordingly, the gate dielectric layer 140 includes a substantial amount of nitrogen. For example, the interface 240 between the gate dielectric layer 140 and the interfacial layer 112 includes nitrogen. In some embodiments, the gate dielectric layer 140 includes Hf. Similar to what has been described above with respect to FIG. 5A, a ratio of the concentration of the nitrogen atom at the interface 240 to that of the Hf is about 2:98 to about 5:95. In some embodiments, the concentrations of the nitrogen atoms may be analytically measured, such as with a TEM instrument. For example, a ratio of the peak associated with the nitrogen to the peak associated with the Hf measured by TEM is about 0.5:1 to about 1.3:1. Moreover, because nitrogen is distributed throughout the gate dielectric layer 140, the interface 250 with the inner spacers 115 also includes nitrogen. Moreover, referring back to FIG. 24, the nitrogen concentration at the cross-section 260 may be higher than the nitrogen concentration at the interface 240. In some embodiments, conducting the annealing operation 304 at this processing stage provides better device reliability as compared to conducting the annealing operation 304 at later stages (which is similar to the second and third approaches described above with respect to FIG. 5B, 5C, 5D, or 5E). However, this disclosure contemplates conducting the annealing at a subsequent processing stage as well.

Figure 16:
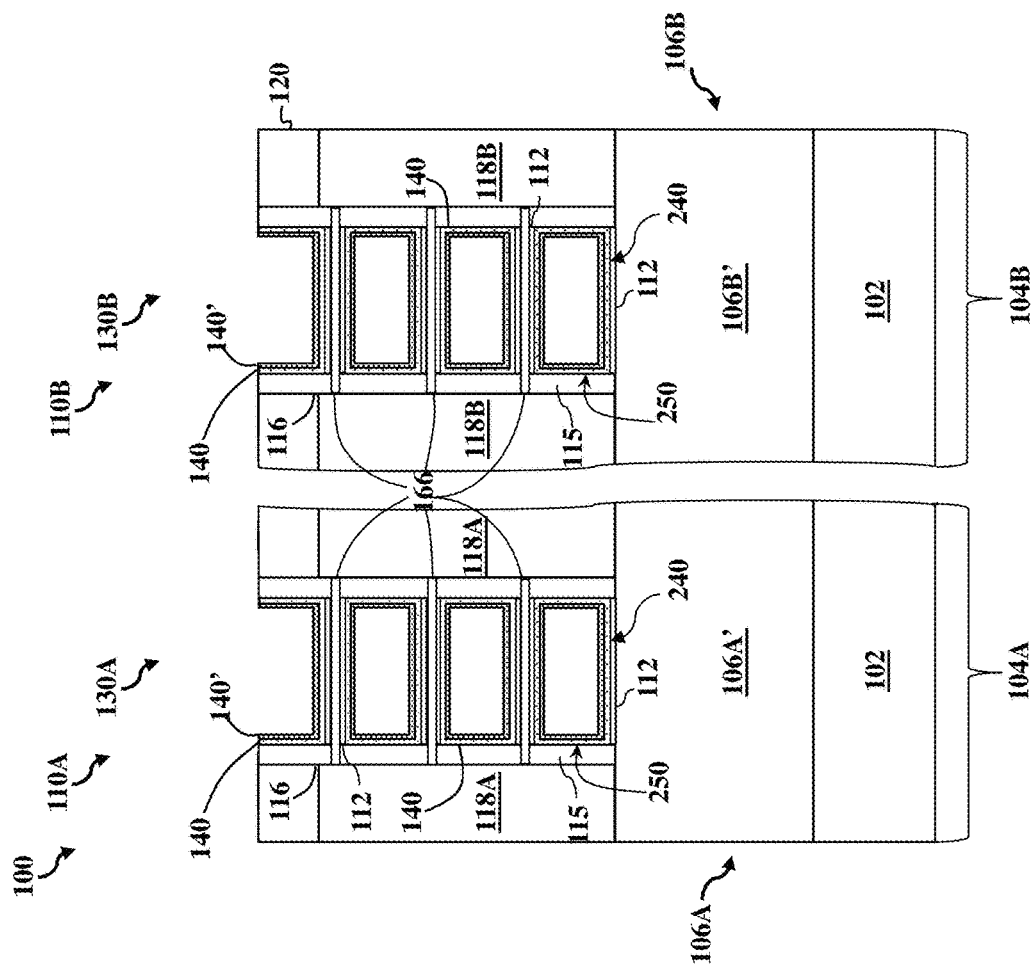

Turning to FIG. 16, a second gate dielectric layer 140' is optionally formed on the gate dielectric layer 140. In some embodiments, the second gate dielectric layer 140' improves the device performances, for example, as described in U.S. patent application Ser. No. 17/036,418 entitled "Multi-Layer High-K Gate Dielectric Structure" to Hsu, et. al., filed on Sep. 29, 2020, and in U.S. patent application Ser. No. 17/038,309 entitled "Post Gate Dielectric Processing for Semiconductor Device Fabrication" to Hsu, et. al., filed on Sep. 30, 2020, both of which are herein incorporated by reference. For example, following the annealing operation 304, another dielectric material is deposited over the annealed gate dielectric layer 140 to form the gate dielectric layer 140'. The dielectric material may be similar or dissimilar to the material of the gate dielectric layer 140. Accordingly, the workpiece 100 now includes two gate dielectric layers with the bottom layer 140 being passivated with active nitrogen and the top layer 140' not being passivated by the active nitrogen. The gate dielectric layer 140' directly interfaces with the gate dielectric layer 140. In some embodiments, the gate dielectric layer 140' is omitted.

Figure 17:
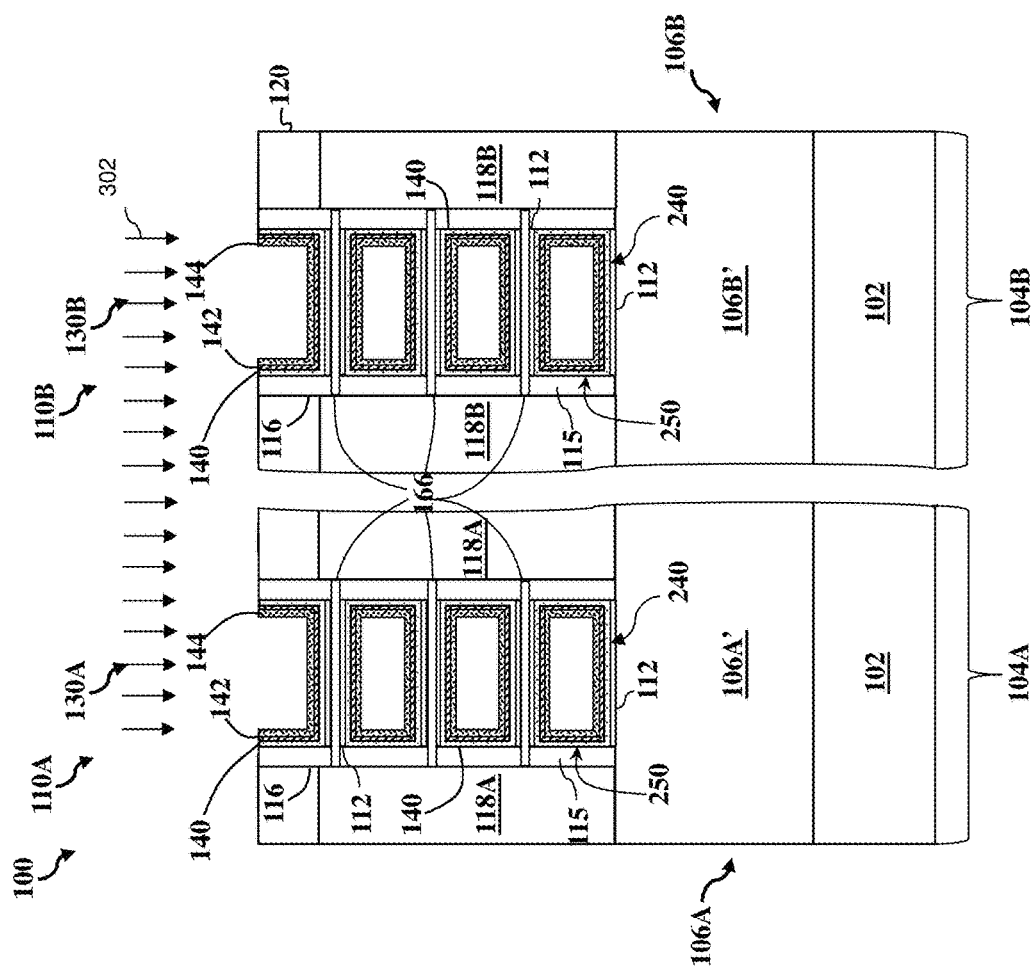
Figure 18:
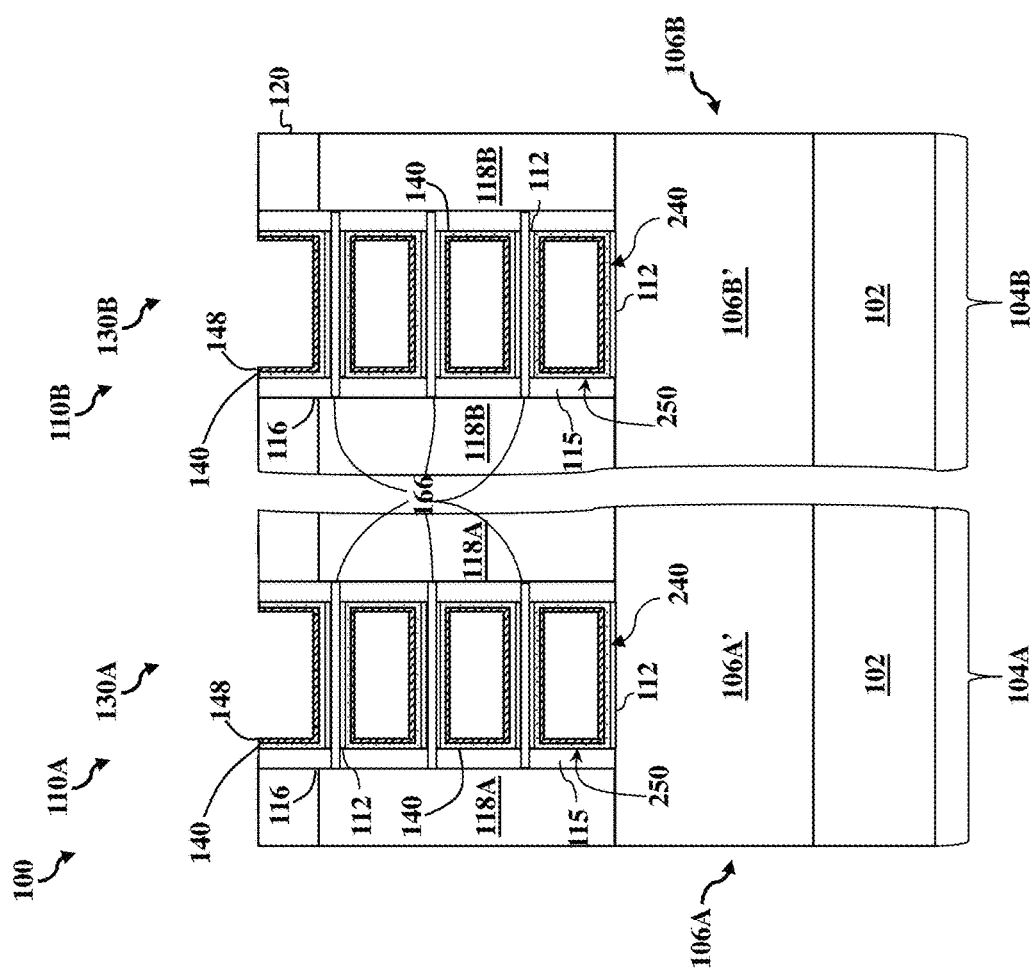
Figure 19:
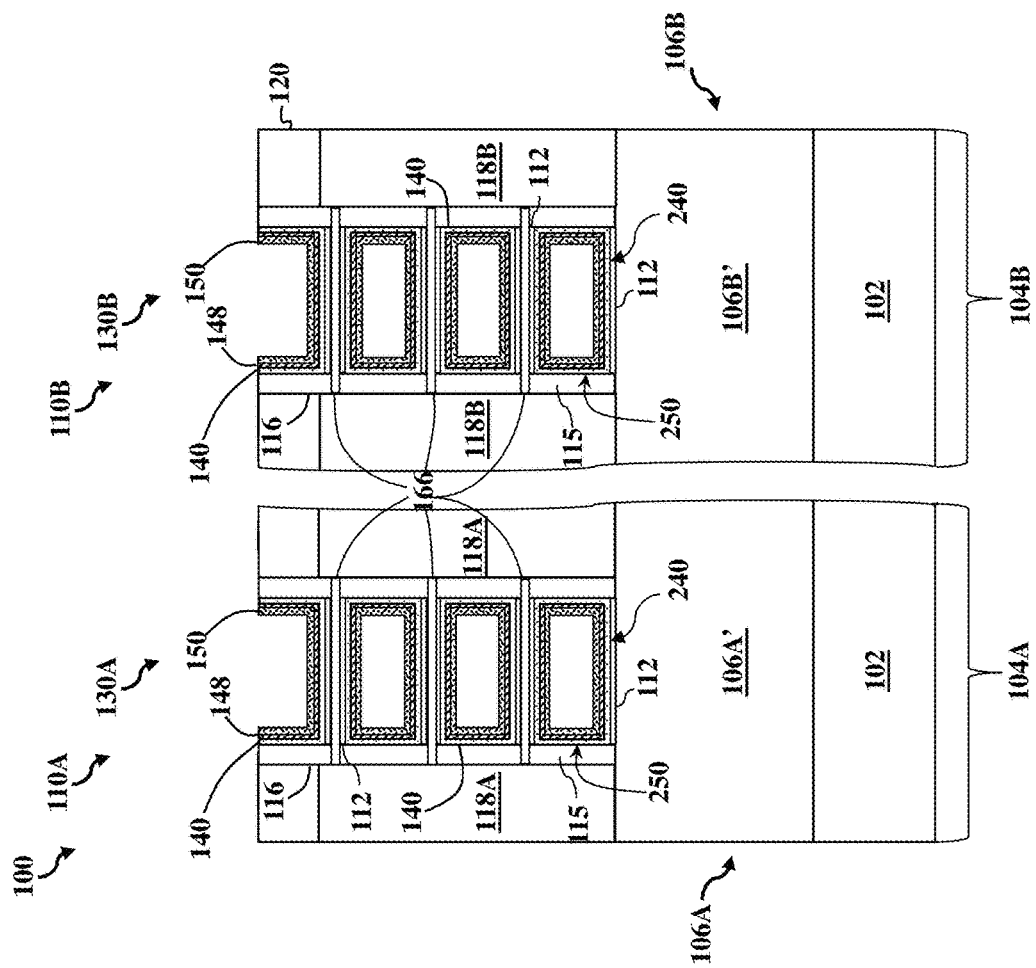
Figure 20:
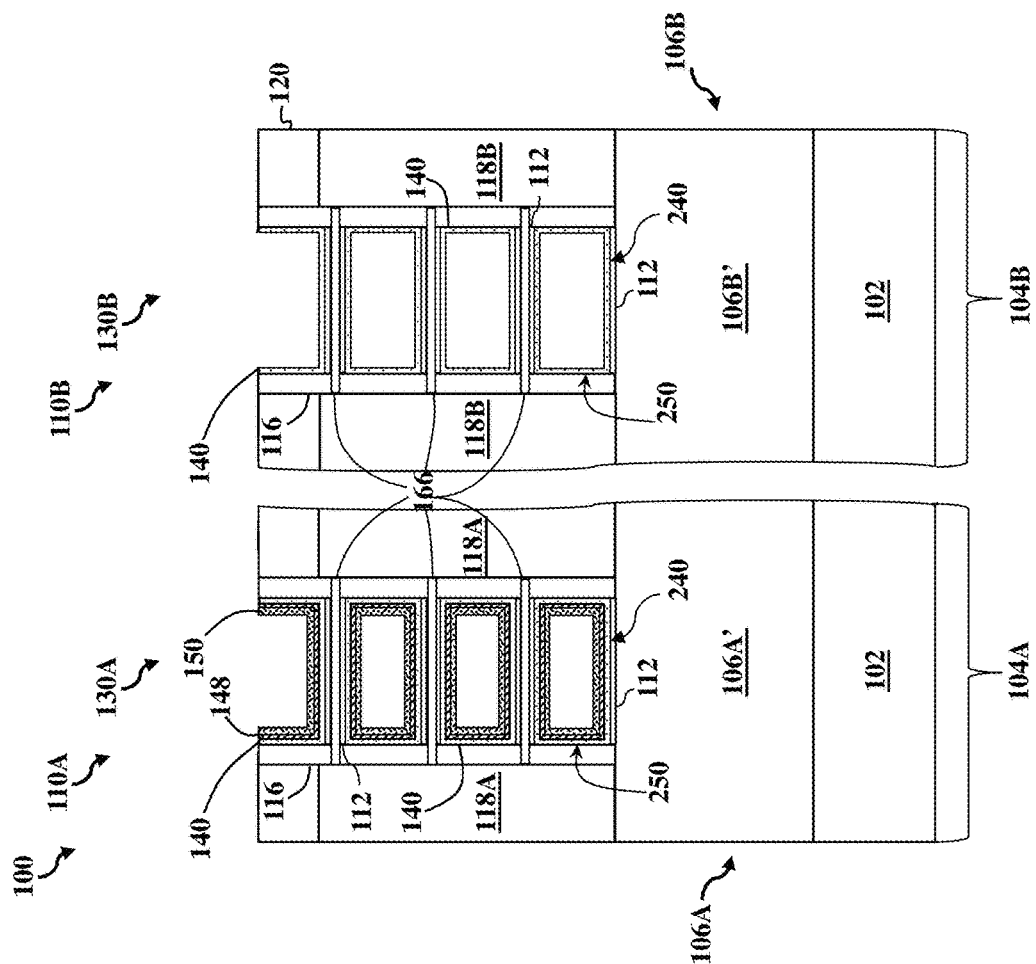
Figure 21:
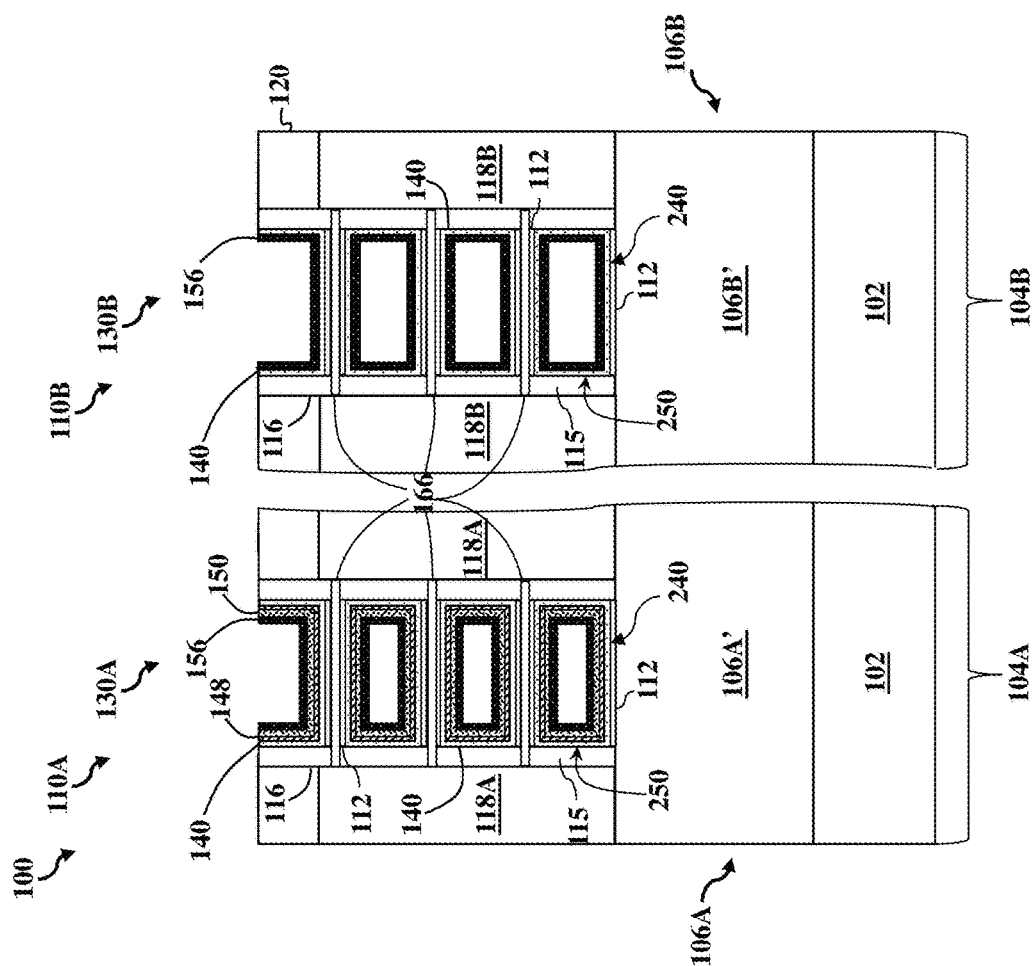
Figure 22:
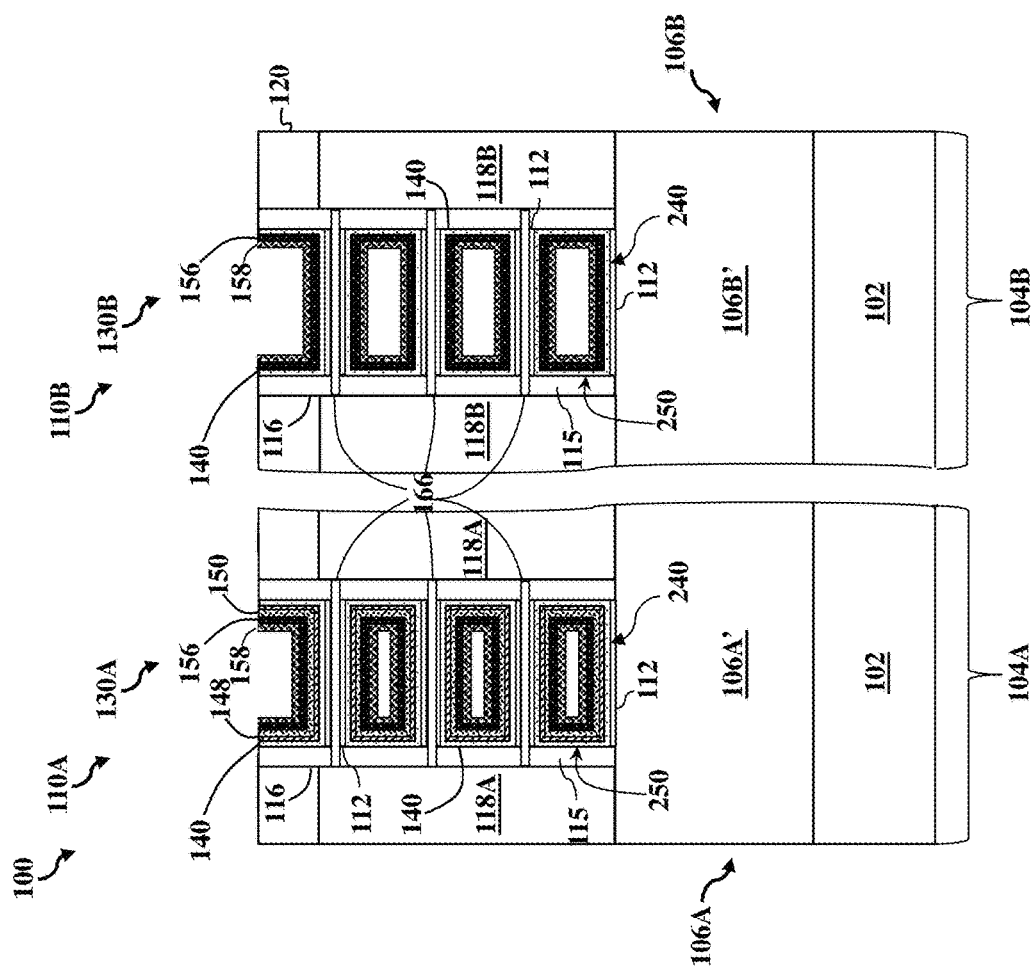
Figure 23:
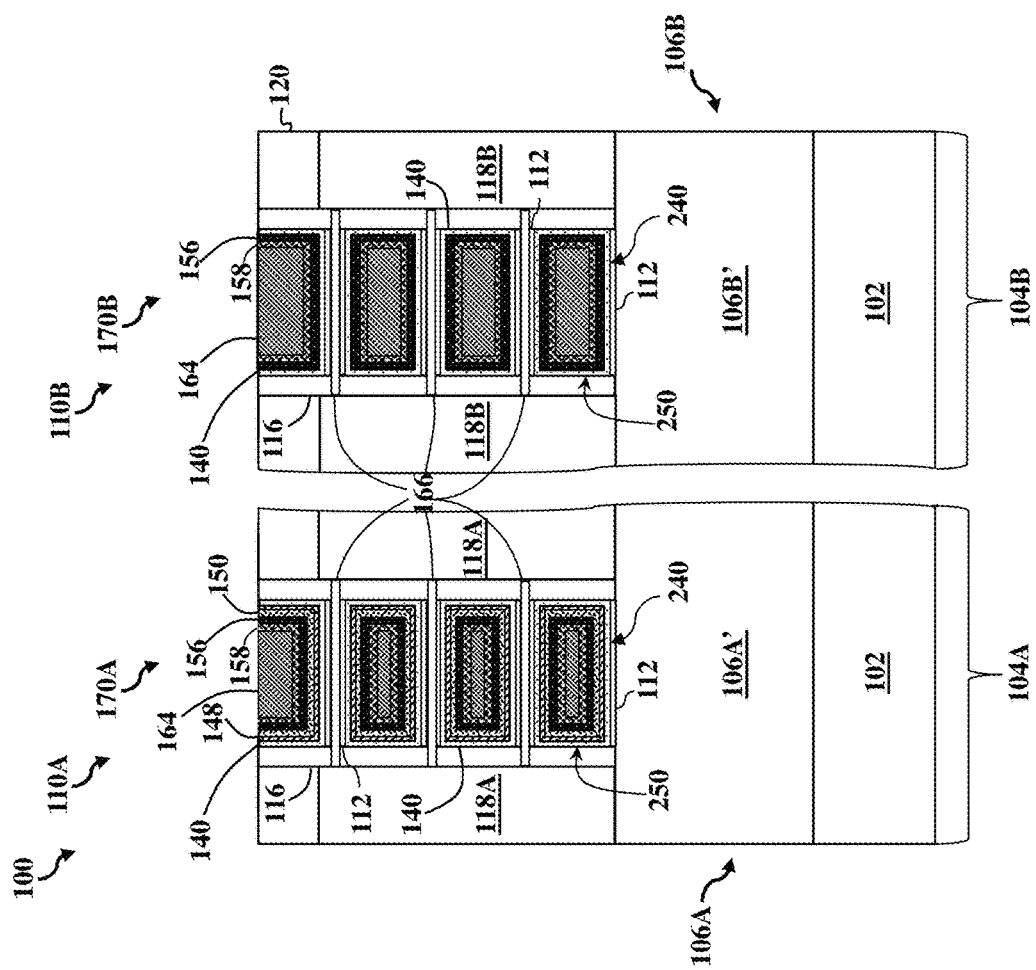

Turning to FIG. 17, a capping layer 142 is formed on the gate dielectric layer 140 (or the gate dielectric layer 140' if present). In some embodiments, another capping layer 144 is optionally formed on the capping layer 142. The capping layers 142 and 144 may be similar to those already described above with respect to FIGS. 5B and 5D, respectively. An annealing operation 302 is conducted at this stage. The annealing operation 302 may be similar to the annealing operation 302 described above with respect to FIGS. 5B and 5D. Following the conclusion of the annealing operation 302, the capping layer 142 (and the layer 144, if present) are removed. Where the annealing operation 304 is not conducted earlier, it may be conducted at this time so as to achieve the passivation of gate dielectric layer 140, similar to those described with respect to FIG. 5B, 5C, 5D, or 5E.

Turning to FIGS. 18-23, processing proceeds to form the gate electrode layers for the gate structures 110A, 110B. For example, n-type work function layer 148 is formed in the openings 130A, 130B on and directly contacting the passivated gate dielectric layer 140 (see FIG. 18). Where the gate dielectric layer 140' is present (not shown), the n-type work function layer 148 is formed directly contacting the gate dielectric layer 140'. A capping layer 150 is formed on the n-type work function layer 148 (see FIG. 19). Then, the n-type work function layer 148 and the capping layer 150 are removed from the n-type region 104B but not from the p-type region 104A (see FIG. 20). This may be achieved by implementing a masking element such as those described above with respect to FIG. 8. Subsequently, a p-type work function layer 156 is formed in the openings 130A, 130B (see FIG. 21). The p-type work function layer 156 directly interfaces with the capping layer 150 in the p-type region 104A, but directly interfaces with the passivated gate dielectric layer 140 (or the gate dielectric layer 140') in the n-type region 104B. Moreover, a capping layer 158 may be formed on top of the p-type work function layer 156 (see FIG. 22). A metal fill layer 164 is formed to fill the remaining spaces of the openings 130A, 130B, thereby completing the fabrication of the gate electrodes 170A, 170B (see FIG. 23).

As described above, in the depicted embodiments, the gate electrode 170A includes the n-type work function layer 148, the capping layer 150, the p-type work function layer 156 and the capping layer 158. The gate electrode 170A directly interfaces with the passivated gate dielectric layer 140. Moreover, the interface between the gate electrode 170A and the gate dielectric layer 140 includes nitrogen atom incorporated from the annealing operation 304. In some embodiments, the p-type work function layer 156 and the capping layer 158 may be removed and not present as part of the gate electrode 170A. Meanwhile, the gate electrode 170B includes the p-type work function layer 156 and the capping layer 158. The gate electrode 170B directly interfaces with the gate dielectric layer 140. Moreover, the interface between the gate electrode 170B and the gate dielectric layer 140 includes nitrogen atom incorporated from the annealing operation 304. Furthermore, as described above with respect to FIGS. 2-12, the nitrogen atoms incorporated during the annealing operation 304 migrates through the gate dielectric layer 140 and towards the interfacial layer 112. The parameters of the annealing operations 302 and 304 may be tuned to control the distribution profiles of the nitrogen atoms throughout the gate dielectric layer 140. In some embodiments, the interface between the gate dielectric layer 140 and the inner spacers 115 also includes nitrogen. In some embodiments, where the gate dielectric layer 140' is formed, the gate electrode 170A, 170B each directly contacts gate dielectric layer 140' rather than the gate dielectric layer 140.

The device 100 fabricated according to methods disclosed herein may have certain distinct features. For example, the gate electrode layers 170A, 170B each directly contacting the gate dielectric layer 140 (or the gate dielectric layer 140'), without intervening capping layers in between. For another example, the gate dielectric layer 140 may include a certain amount of nitrogen atoms. Moreover, the ratio $r_I = I_N/I_{Hf}$, measured with TEM at the interface 240, may be about 0.5 to about 1.3. Furthermore, the nitrogen concentration at cross-section 260 may be greater than the nitrogen concentration at the interface 240. These design features may lead to various advantages. It is understood, however, that different embodiments may have different advantages, not all advantages are necessarily described herein, and no particular advantage is necessarily required of any embodiment. For example, because of the passivation of the gate dielectric layer 140, electron migration through the gate dielectric layer 140 of the n-type device is reduced in the OFF-state, thereby reducing the leakage current. Meanwhile, because the nitrogen incorporated is not excessively high, the properties of p-type devices is not adversely impacted. Accordingly, time-dependent dielectric breakdown (TDDB) for the n-type device is improved. For example, the maximum voltage that the dielectric may withstand is improved by about 10 mV to about 30 mV, and the lifetime under testing condition (which simulates an accelerated operation condition) is improved by a factor of about 2 to about 4. Meanwhile, TDDB, lifetime and Vmax for the p-type device are minimally affected. Moreover, the metal boundary effect is reduced by about 5 mV to about 15 mV, which further improves the threshold voltage variation by about 0.5 mV to about 2.0 mV. Accordingly, the Vmin is improved by about 25 mV to about 50 mV; and read and write margin is improved by about 1% to about 5%. In some embodiments, the reliability improvement realized by implementing the methods provided herein may be leveraged to improve performances. For example, as the leakage current is reduced, the thickness for the gate dielectric layers 140 and/or the interfacial layers 112 may further reduced to achieve better performance, without adversely affecting the device reliability, as compared to approaches not implementing the methods of this disclosure.

Furthermore, fabrication can proceed to complete fabrication of IC device 100. For example, various contacts can be formed to facilitate operation of devices. For example, one or more ILD layers, similar to ILD layer 120, can be formed over substrate 102 (in particular, over ILD layer 120 and gate structures 110A and 110B). Contacts can then be formed in ILD layer 120 and/or ILD layers disposed over ILD layer 120. For example, contacts are respectively electrically coupled with gate structures 110A and 110B (particularly, gate electrodes of gate structures 110A and 110B), and contacts are respectively electrically coupled to source/drain regions (particularly, epitaxial source/drain features 118A and 118B). Contacts include a conductive material, such as a metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, ILD layers disposed over ILD layer 120 and the contacts (for example, extending through ILD layer 120 and/or the other ILD layers) are a portion of an MLI feature disposed over substrate 102, as described above. The MLI feature can include a combination of metal layers and ILD layers configured to form vertical interconnect features, such as contacts and/or vias, and/or horizontal interconnect features, such as lines. The various conductive features include materials similar to the contacts. In some implementations, a damascene process and/or dual damascene process is used to form the MLI feature.

The present disclosure provides for many different embodiments. One general aspect is directed to a device. The device includes a semiconductor substrate, a fin structure on the semiconductor substrate, a gate structure on the fin structure, and a pair of source/drain features on both sides of the gate structure. The gate structure includes an interfacial layer on the fin structure, a gate dielectric layer on the interfacial layer, and a gate electrode layer of a conductive material on and directly contacting the gate dielectric layer. The gate dielectric layer includes nitrogen element.

In some embodiments, the pair of source/drain features are n-type doped source/drain features, and the conductive material is an n-type work function material. In some embodiments, the gate dielectric layer includes hafnium (Hf). Moreover, an interface between the gate dielectric layer and the interfacial layer includes the nitrogen element. In some embodiments, a ratio of an atomic percentage of the nitrogen element on the interface to an atomic percentage of the Hf on the interface is about 2:98 to about 5:95. In some embodiments, a first peak associated with the nitrogen element at the interface has a first intensity measured by transmission electron microscopy. A second peak associated with the Hf at the interface has a second intensity measured by transmission electron microscopy. A ratio of the first intensity to the second intensity is about 0.5:1 to about 1.3:1. In some embodiments, the fin structure includes a plurality of suspended channel layers vertically stacked over the semiconductor substrate. The suspended channel layers are each between the pair of source/drain features. Moreover, portions of the gate structure are between vertically adjacent suspended channel layers. In some embodiments, the device further includes inner spacers. And the inner spacers each have a surface shared with the gate dielectric layer. Moreover, the surface includes nitrogen element.

One general aspect is directed a method. The method includes receiving a semiconductor workpiece that has a gate structure over a fin structure, and removing a portion of the gate structure to form a gate opening. The gate opening exposes a surface of the fin structure. The method also includes forming an interfacial layer on the exposed surface of the fin structure, forming a gate dielectric layer on the interfacial layer, and annealing the semiconductor workpiece in an active nitrogen atmosphere to form a passivated gate dielectric layer. The method further includes forming a gate electrode layer on and directly contacting the passivated gate dielectric layer.

In some embodiments, the annealing is a first annealing. The method further includes forming a capping layer on the gate dielectric layer. After forming the capping layer, the method includes conducting a second annealing. Moreover, after conducting the second annealing, the method also includes removing the capping layer to expose the gate dielectric layer. In some embodiments, the annealing includes annealing in ammonia, and the annealing includes a spike annealing phase at a temperature of about 800° C. to 900° C. within a time duration of less than 1 second. In some embodiments, the annealing includes annealing at a temperature of about 520° C. to about 590° C. and at pressure at about 1 torr to about 20 torr for a time duration of about 5 seconds to about 30 seconds. In some embodiments, the annealing includes annealing in an ambient that includes ammonia and nitrogen ($N_2$) gas. Moreover, a volumetric concentration of the ammonia is about 10% to about 60%.

In some embodiments, the fin structure includes a plurality of suspended channel layers, and the method further includes, after the forming of the passivated gate dielectric layer, forming a capping layer on the passivated gate dielectric layer. And the method additionally includes conducting another annealing on the semiconductor workpiece having the capping layer. Still further, the method includes removing the capping layer after the conducting of the another annealing and before the forming of the gate electrode layer. In some embodiments, the forming of the gate electrode layer includes forming the gate electrode layer having an n-type work function metal layer directly contacting the passivated gate dielectric layer. In some embodiments, the gate dielectric layer is a first gate dielectric layer, and the method further includes forming a second gate dielectric layer on the passivated gate dielectric layer. In some embodiments, the gate electrode layer is formed on the second gate dielectric layer.

One general aspect is directed to a method. The method includes receiving a semiconductor workpiece having a gate opening exposing a portion of a fin structure. The fin structure has a plurality of suspended channel layers. The method also includes forming an interfacial layer in the gate opening and surrounding each of the suspended channel layers. The method further includes forming a gate dielectric layer on the interfacial layer, forming a capping layer on the gate dielectric layer, and after forming the capping layer, annealing the semiconductor workpiece. The method additionally includes removing the capping layer from the annealed semiconductor workpiece to expose the gate dielectric layer, and forming a gate electrode layer on and directly contacting the exposed gate dielectric layer.

In some embodiments, the annealing is a first annealing. The forming of the gate dielectric layer includes depositing a gate dielectric material on the interfacial layer, and conducting a second annealing of the semiconductor workpiece in an ambient that includes active nitrogen at a concentration of about 10% to about 60% to form an annealed gate dielectric material. In some embodiments, the conducting of the second annealing includes annealing at a soak temperature of about 520° C. to about 590° C. and at pressure at about 1 torr to about 20 torr for a time duration of about 5 seconds to about 30 seconds. Moreover, the second annealing also includes annealing at a temperature of about 800° C. to 900° C. for a time duration of less than 1 second. In some embodiments, the forming of the gate dielectric layer further includes, after the conducting of the second annealing of the semiconductor workpiece, depositing another gate dielectric material on the annealed gate dielectric material. Moreover, the forming of the capping layer includes forming on the another gate dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device, comprising:
a semiconductor substrate;

a fin structure on the semiconductor substrate;
a gate structure on the fin structure, the gate structure including:
   an interfacial layer on the fin structure;
   a gate dielectric layer on the interfacial layer, the gate dielectric layer including nitrogen element;
   a gate electrode layer of a conductive material on and directly contacting the gate dielectric layer; and
a pair of source/drain features on both sides of the gate structure,
wherein the gate dielectric layer comprises a first interface with the interfacial layer and a second interface with the gate electrode layer,
wherein a nitrogen concentration at the first interface is greater than a nitrogen concentration at the second interface.

2. The device of claim 1, wherein the pair of source/drain features are n-type doped source/drain features, and the conductive material is an n-type work function material.

3. The device of claim 1, wherein the gate dielectric layer includes hafnium (Hf).

4. The device of claim 3, wherein a ratio of an atomic percentage of the nitrogen element on the first interface to an atomic percentage of the Hf on the first interface is about 2:98 to about 5:95.

5. The device of claim 3, wherein a first peak associated with the nitrogen element at the first interface has a first intensity, a second peak associated with the Hf at the first interface has a second intensity, the first and the second peaks measured by transmission electron microscopy, and wherein a ratio of the first intensity to the second intensity is about 0.5:1 to about 1.3:1.

6. The device of claim 1, wherein the fin structure includes a plurality of suspended channel layers vertically stacked over the semiconductor substrate, the suspended channel layers each being between the pair of source/drain features, and
   wherein portions of the gate structure are between vertically adjacent suspended channel layers.

7. The device of claim 6, further comprising inner spacers, the inner spacers each having a surface shared with the gate dielectric layer, wherein the surface includes nitrogen element.

8. A method, comprising:
receiving a semiconductor workpiece having a gate structure over a fin structure;
removing a portion of the gate structure to form a gate opening, the gate opening exposing a surface of the fin structure;
forming an interfacial layer on the exposed surface of the fin structure;
forming a gate dielectric layer on the interfacial layer;
annealing the semiconductor workpiece in an active nitrogen atmosphere to form a passivated gate dielectric layer; and
forming a gate electrode layer on and directly contacting the passivated gate dielectric layer.

9. The method of claim 8, wherein the annealing is a first annealing, the method further comprising:
forming a capping layer on the gate dielectric layer;
after forming the capping layer, conducting a second annealing; and
after conducting the second annealing, removing the capping layer to expose the gate dielectric layer.

10. The method of claim 8, wherein the annealing includes annealing in ammonia and the annealing includes a spike annealing phase at a temperature of about 800° C. to 900° C. within a time duration of less than 1 second.

11. The method of claim 8, wherein the annealing includes annealing at a temperature of about 520° C. to about 590° C. and at pressure at about 1 Torr to about 20 Torr for a time duration of about 5 seconds to about 30 seconds.

12. The method of claim 8, wherein the annealing includes annealing in an ambient that includes ammonia and nitrogen ($N_2$) gas, and wherein a volumetric concentration of the ammonia is about 10% to about 60%.

13. The method of claim 8, wherein the fin structure includes a plurality of suspended channel layers, the method further comprising:
after the forming of the passivated gate dielectric layer, forming a capping layer on the passivated gate dielectric layer;
conducting another annealing on the semiconductor workpiece having the capping layer; and
after the conducting of the another annealing and before the forming of the gate electrode layer, removing the capping layer.

14. The method of claim 8, wherein the forming of the gate electrode layer includes forming the gate electrode layer having an n-type work function metal layer directly contacting the passivated gate dielectric layer.

15. The method of claim 8, wherein the gate dielectric layer is a first gate dielectric layer, the method further comprising forming a second gate dielectric layer on the passivated gate dielectric layer.

16. The method of claim 15, wherein the gate electrode layer is formed on the second gate dielectric layer.

17. A method, comprising:
receiving a semiconductor workpiece having a gate opening exposing a portion of a fin structure, the fin structure having a plurality of suspended channel layers;
forming an interfacial layer in the gate opening and surrounding each of the suspended channel layers;
forming a gate dielectric layer on the interfacial layer;
forming a capping layer on the gate dielectric layer;
after forming the capping layer, annealing the semiconductor workpiece;
removing the capping layer from the annealed semiconductor workpiece to expose the gate dielectric layer; and
forming a gate electrode layer on and directly contacting the exposed gate dielectric layer.

18. The method of claim 17, wherein the annealing is a first annealing, and wherein the forming of the gate dielectric layer includes:
depositing a gate dielectric material on the interfacial layer; and
conducting a second annealing of the semiconductor workpiece in an ambient that includes active nitrogen at a concentration of about 10% to about 60% to form an annealed gate dielectric material.

19. The method of claim 18, wherein the conducting of the second annealing includes annealing at a soak temperature of about 520° C. to about 590° C. and at pressure at about 1 Torr to about 20 Torr for a time duration of about 5 seconds to about 30 seconds, and further includes annealing at a temperature of about 800° C. to 900° C. for a time duration of less than 1 second.

20. The method of claim 18, wherein the forming of the gate dielectric layer further includes, after the conducting of the second annealing of the semiconductor workpiece, depositing another gate dielectric material on the annealed gate dielectric material, and wherein the forming of the capping layer includes forming on the another gate dielectric material.

* * * * *